US012777923B2

(12) United States Patent
Langenbuch et al.

(10) Patent No.: US 12,777,923 B2
(45) Date of Patent: Oct. 27, 2026

(54) METHODS AND APPARATUS FOR IMPLEMENTING CAPACITORS IN SEMICONDUCTOR DEVICES

(71) Applicant: Intel Corporation, Santa Clara, CA (US)

(72) Inventors: Michael Langenbuch, Munich (DE); Carla Moran Guizan, Munich (DE); Mamatha Yakkegondi Virupakshappa, Munich (DE); Roshini Sachithanandan, Munich (DE); Philipp Riess, Munich (DE); Jonathan Jensen, Greenville, SC (US); Peter Baumgartner, Munich (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/320,763

(22) Filed: May 19, 2023

(65) Prior Publication Data

US 2024/0387353 A1 Nov. 21, 2024

(51) Int. Cl.

| | |
|---|---|
| ***H10D 1/60*** | (2025.01) |
| ***H10D 1/68*** | (2025.01) |
| ***H10W 20/40*** | (2026.01) |
| ***H10W 44/20*** | (2026.01) |

(52) U.S. Cl.

CPC .......... *H10W 20/496* (2026.01); *H10D 1/696* (2025.01); *H10W 44/20* (2026.01); *H10W 44/251* (2026.01)

(58) Field of Classification Search

CPC ................ H01L 23/5223; H01L 23/66; H01L 2223/6683; H01L 23/5222; H01L 23/642; H10D 1/696; H10D 1/716; H10D 1/60; H10D 1/68; H10D 1/692; H10D 1/711; H10W 20/496; H10W 44/20; H10W 44/251

See application file for complete search history.

(56) References Cited

U.S. PATENT DOCUMENTS 7,332,764 B2 * 2/2008 Choi ................ H01L 21/76846 257/296

8,436,408 B2 * 5/2013 Tu ...................... H01L 23/5223 438/957

(Continued)

OTHER PUBLICATIONS

United States Patent and Trademark Office, "Requirement for Restriction/Election," issued in connection with U.S. Appl. No. 17/485,039, dated Oct. 31, 2024, 8 pages.

(Continued)

*Primary Examiner* — Eduardo A Rodela

(74) *Attorney, Agent, or Firm* — Hanley, Flight & Zimmerman, LLC

(57) ABSTRACT

Methods and apparatus are disclosed for implementing capacitors in semiconductor devices. An example semiconductor die includes a first dielectric material disposed between a first metal interconnect and a second metal interconnect; and a capacitor positioned within a via extending through the first dielectric material between the first and second metal interconnects, the capacitor including a second dielectric material disposed in the via between the first and second metal interconnects.

20 Claims, 11 Drawing Sheets

(56) References Cited

U.S. PATENT DOCUMENTS

| | | | | |
|---|---|---|---|---|
| 8,519,510 | B2 * | 8/2013 | Doyle | H10B 12/318 257/532 |
| 9,076,758 | B2 * | 7/2015 | Lindert | H10D 1/716 |
| 9,391,015 | B2 | 7/2016 | Jeannot et al. | |
| 9,601,545 | B1 * | 3/2017 | Tu | H10B 63/80 |
| 9,698,213 | B1 * | 7/2017 | Yang | H01L 21/31053 |
| 9,741,817 | B2 * | 8/2017 | Lisiansky | H01L 23/5223 |
| 9,818,689 | B1 * | 11/2017 | Zang | H01L 23/5223 |
| 9,876,068 | B1 * | 1/2018 | Yang | H10D 1/716 |
| 11,075,157 | B2 * | 7/2021 | Eissa | H01L 21/76877 |
| 12,310,001 | B2 * | 5/2025 | Alzate-Vinasco | H10D 1/716 |
| 2007/0267674 | A1 * | 11/2007 | Lin | H10B 12/50 257/306 |
| 2010/0059806 | A1 * | 3/2010 | Mizushima | H01L 23/5223 257/E27.084 |
| 2011/0266603 | A1 * | 11/2011 | Nakamura | H10B 12/09 257/532 |
| 2012/0056298 | A1 * | 3/2012 | Kuroki | H10B 12/09 257/532 |
| 2013/0242643 | A1 * | 9/2013 | Kim | H10B 12/50 365/149 |
| 2014/0144681 | A1 | 5/2014 | Pushparaj et al. | |
| 2015/0043126 | A1 | 2/2015 | Hurwitz et al. | |
| 2020/0395435 | A1 | 12/2020 | Haratipour et al. | |
| 2021/0091169 | A1 * | 3/2021 | Lin | H01L 21/02252 |
| 2023/0095846 | A1 | 3/2023 | Duong et al. | |

OTHER PUBLICATIONS

United States Patent and Trademark Office, "Non-Final Office Action," issued in connection with U.S. Appl. No. 17/485,039, dated Jan. 14, 2025, 11 pages.

United States Patent and Trademark Office, "Notice of Allowance and Fee(s) Due," issued in connection with U.S. Appl. No. 17/485,039, dated Jul. 30, 2025, 9 pages.

* cited by examiner

METHODS AND APPARATUS FOR IMPLEMENTING CAPACITORS IN SEMICONDUCTOR DEVICES

FIELD OF THE DISCLOSURE

This disclosure relates generally to integrated circuits and, more particularly, to methods and apparatus for implementing capacitors in semiconductor devices.

BACKGROUND

Semiconductor devices (e.g., integrated circuits (IC), semiconductor packages, etc.) include interconnections of electronic components such as (but not limited to) capacitors, resistors, transistors, etc., which are built-up from semiconducting material (e.g., a semiconductor wafer or substrate). Capacitors are passive electronic components included in most electrical circuitry.

Figure 1:
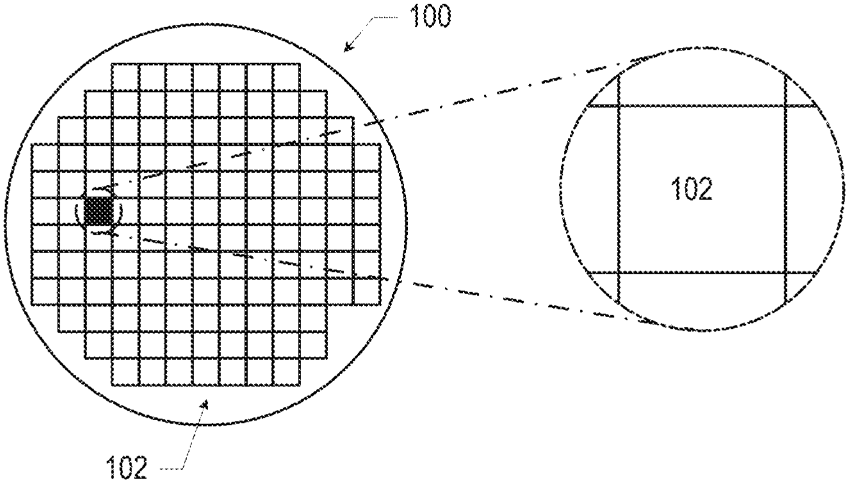
FIG. 1 is a top view of a wafer including dies that may be constructed in accordance with teachings disclosed herein.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, and/or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. It is to be understood that semiconductor devices are often used in orientation different than their orientation during fabrication. Thus, when referring to a semiconductor device (e.g., a transistor), a semiconductor die containing a semiconductor device, and/or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the term "substantially perpendicular" means exactly perpendicular or within +/−5 degrees of exactly perpendicular. As used herein, the term "substantially parallel" means exactly parallel or within +/−5 degrees of exactly perpendicular.

As used herein, high frequency refers to a frequency higher than 30 gigahertz (GHz) unless directly stated otherwise. As used herein, front-end-of-line (FEOL) and back-end-of-line (BEOL) refer to stages in an IC manufacturing line or fabrication process. The FEOL, also referred to as wafer processing, refers to portions of the IC fabrication process during which certain electronic components (e.g., a transistor, resistor, etc.) are patterned on a semiconductor substrate (e.g., a wafer). As used herein, the term "front end" refers to an output of the FEOL process, including a semiconductor substrate and components thereof. The BEOL, also referred to as assembly processing, refers to portions of the fabrication process during which interconnects between the electrical components of the front end are provided.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

DETAILED DESCRIPTION

In recent years, applications for millimeter wave (mmWave, mmW, etc.) frequencies have proliferated, including applications in remote sensing, automotive radar, imaging, Internet of Things, edge computing, telecommunications (e.g., 5G wireless networks), etc. For example, mmW frequencies offer the potential to support larger bandwidths and higher data rates than current wireless networks offer. Millimeter waves are electromagnetic (EM) waves having wavelengths approximately between 1 millimeter (mm) and 10 mm, and associated with the band of radio frequencies of the EM spectrum from approximately 30 gigahertz (GHz) to 300 GHz. In some examples, IC devices (e.g., semiconductor packages semiconductor devices, IC packages, etc.) for implementation at mmW frequencies operate at frequencies between approximately 60 GHz to 110 GHz. However, as used herein, mmW IC devices can operate at any frequencies in the mmW band (e.g., 30 GHz to 300 GHz). Further, examples disclosed herein are not limited to mmW IC devices. Instead, teachings disclosed herein may be implemented in any type of IC devices.

Design and fabrication of IC devices for implementation at mmW frequencies introduces unique challenges due to the high frequency nature of such IC devices. For example, wavelengths reduce in size as frequencies increase, resulting in demands for smaller circuit structures. That is, the mmW IC devices and electronic components therein are typically smaller than those in IC devices that operate at lower frequencies. Further, signal power is typically lower at mmW frequencies (e.g., relative to lower frequency microwave bands), meaning that reducing circuit loss is often an important circuit design goal for mmW IC devices. Moreover, active and passive electronic components tend to behave differently at such high frequencies relative to lower microwave frequencies. For example, as frequency increases, a capacitor's opposition to current, or its capacitive reactance, decreases. Capacitors react against changes in voltage by supplying or drawing current in the direction necessary to oppose the change.

Known capacitive devices are unable to deliver the decoupling capacitance needed to provide low power delivery network (PDN) impedance and stable power delivery at mmW frequencies. In particular, quality (Q) factors of known capacitance devices degrade strongly at high frequencies. A Q factor is an important parameter in IC design that represents the efficiency of a given capacitor in terms of its rate of energy loss. In some examples, the Q factor of a capacitor may be represented by a ratio of capacitive reactance of the capacitor to its equivalent series resistance. The Q factor is not a constant value, but rather changes significantly with frequency.

A previous approach to increase capacitance in mmW IC devices includes fabricating finger capacitors during the BEOL process. As used herein, a finger capacitor includes a first electrode (e.g., metal interconnect) and a second electrode, each of which include electrically conductive finger structures in a spaced-apart, parallel relationship and extending from a line or backbone, such as in a comb-like structure. The finger structures of the first electrode are interleaved or interdigital with the finger structures of the second electrode, with a dielectric material disposed between the finger structures. The finger structures may be formed in a same interconnect level or in various levels and stacked upon one another.

However, the reduced size of mmW IC devices means that typical finger capacitors may not fit in a mmW IC device package. Further, inter-metal dielectric materials are often selected for low capacitance to support beneficial signal routing practices. For example, to lower parasitic capacitance in the BEOL routing, a dielectric material having a relatively low dielectric constant (κ) or relative permittivity (ε) is often used, thereby degrading the use of traditional finger capacitors as capacitors for mmW IC devices. An amount of capacitive coupling between metal interconnects typically depends on at least three factors, including (1) the dielectric constant (κ) or relative permittivity (ε) of the dielectric material separating adjacent metal interconnects, (2) an amount of area of a first metal interconnect that is overlapped by a second metal interconnect, and (3) a thickness of the dielectric material separating the metal interconnects. Capacitance can be increased by increasing the overlapping area and/or the permittivity (ε), or by reducing the dielectric thickness. In many IC devices, the dielectric material used between metal layers (and its associated permittivity) as well as the thickness of the dielectric material are fixed based on standard fabrication processes. Thus, to increase capacitance, finger capacitors are often designed to be relatively long to increase the overlapping area. However, the length of such finger capacitors introduces resistance, which degrades the Q factor of the finger capacitors at high frequencies.

Moreover, capacitance provided by traditional finger capacitors does not scale linearly with multiplicity (e.g., an amount of the finger structures). For example, parasitic capacitance is typically provided between finger structures and the lines of the traditional finger capacitor, which can significantly contribute to the capacitance of the finger capacitor as a whole. This non-linearity needs to be compensated with additional trimming circuits, which can add cost to the fabrication of IC devices containing such traditional finger structures.

While capacitance is provided in an IC package at a transistor gate, referred to as transistor gate capacitance, transistor gates in the FEOL present undesirable bias dependence when used as capacitors. Further, due to resistance in the gate-stack, transistor gates provide poor capacitance performance in mmW IC devices. As wavelengths and circuit dimensions shrink at mmW frequencies, new capacitive structures are needed to provide capacitance in mmW IC devices.

Example methods and apparatus are disclosed herein to increase capacitance or otherwise implement a capacitor in IC devices. In particular, disclosed examples enable fabrication of capacitors (e.g., capacitor structures) in opened vias disposed between two adjacent metal layers or interconnects. A traditional via is typically lined or filled with a conductive material to electrically connect two metal layers. As used herein, an opened via refers to a via that has not been filled with any conductive material (e.g., the via is open and/or includes a resist material). Thus, an opened via is intended to distinguish a via that has been filled (e.g., a metal via, which corresponds to an opened via that has been at least partially filled with metal). Examples disclosed herein provide capacitance between metal interconnects of two adjacent signal paths by bringing the metal interconnects into close proximity in an opened via while maintaining their electrical isolation. Examples disclosed herein employ a material having a relatively high dielectric constant in the opened via to electrically isolate the portions of the metal interconnects that are in close proximity.

In some examples, example capacitors disclosed herein include a first layer of metal (e.g., a first electrode), a second layer of metal (e.g., a second electrode) adjacent the first layer of metal, and an insulating (e.g., dielectric) layer positioned between the first and second layers of metal. For example, the dielectric layer may be formed of the second dielectric material. In some examples, the example capacitors disclosed herein include a barrier layer positioned between the dielectric material and at least one of the first or second layers of metal.

Examples disclosed herein fabricate a capacitor directly into an opened via of an inter-metal dielectric layer between two adjacent metal layers (e.g., first and second metal interconnects). That is, in some examples, metal in contact with at least one of the two adjacent metal layers extends into the opened via to reduce the distance between the two electrodes (e.g., the two metal layers) to increase capacitance. In some examples, standard fabrication processes are still employed such that there is no significant change to known fabrications processes. However, in some examples, the second dielectric material is deposited in the opened via by one or more additional process operations to provide an insulting layer between the two adjacent metal layers (including the metal extending into the via from one or both of the metal layers). In particular, a standard fabrication process may include opening a via in a layer of a first dielectric material disposed on a first layer of metal. Thereafter, in some examples, a second (e.g., capacitor, etc.) dielectric material is deposited to provide insulation between the first layer of metal and a subsequently deposited second layer of metal.

The first dielectric material can be added before and/or after metal is added to partially fill the opened via to reduce the distance between the two electrodes. The reduced distance between the two electrodes results in a reduced thickness of the first dielectric material, thereby contributing to an increase in capacitance. Additionally or alternatively, in some examples, first excess metal deposited within the via in contact with one of the two metal layers is fabricated to include an opening or recess into which second excess metal in contact with the other metal layer extends. That is, the first excess metal surrounds and/or is lateral adjacent to the second excess metal. In such examples, the two portions of excess metal remain isolated and separated by the first dielectric layer disposed therebetween. Having one portion of metal extend into a second portion of metal within the opened via in such examples, not only reduces the distance between the two electrodes but also increases the surface area between the electrodes, thereby further increasing capacitance.

Example capacitors fabricated in opened vias as disclosed herein are decoupled from the materials used in a standard BEOL process. As such, a first dielectric material used for inter-metal dielectric layers of an IC device can be selected for low capacitance to support high quality signal routing. A second dielectric material used for the example capacitors disclosed herein can be selected for high capacitance. In particular, the first dielectric material may be associated with a first dielectric constant that is lower than a second dielectric constant associated with the second dielectric material. Additionally, the second dielectric material can be selected based on a specific application of a given IC device.

Example capacitors disclosed herein can be employed by mmW semiconductor devices to provide or otherwise increase capacitance in corresponding electronic circuits. By using the place of the opened via, example capacitors herein can be realized in positions that suit an application for a given IC circuit. For example, mmW IC devices may benefit from increased capacitance near power signal lines in a BEOL. In some such examples, example capacitors disclosed herein can be between adjacent power signal lines to provide increased capacitance to the mmW IC device in a beneficial manner. Example capacitors disclosed do not need to utilize BEOL routing wires for capacitor fabrication. As such, routing during the BEOL stage can be designed for low inductance (e.g., as needed for mmW IC device). While example capacitors can be advantageously employed in mmW IC devices, teachings disclosed herein are not limited to such devices. Rather, example capacitors disclosed herein can be employed in any type of IC devices.

Example capacitors disclosed herein improve integration density by providing a capacitive device that does not interfere with an active area in FEOL nor adjacent routing metals in the BEOL. Example capacitors disclosed herein can be employed between example finger structures fabricated in the BEOL. As noted above, traditional finger capacitors include interleaved or interdigital finger structures of different electrodes, which introduces parasitic capacitance. Examples disclosed herein enable fabrication of stacked finger structures having example capacitors disclosed herein disposed therebetween. Disclosed example can reduce parasitic capacitance between finger structures disclosed herein (relative to traditional finger capacitors) to enable or otherwise improve scaling of exact multiple of capacitance values.

Example capacitors disclosed herein can be employed in a capacitor bank, which is a group of capacitors of the same rating that are connected in series or in parallel. Example capacitors disclosed herein enable or otherwise improve scaling of exact multiple of capacitance values to facilitate linear scaling of capacitance to amount of capacitors. With this linearity, capacitor banks can be achieved without design overhead.

FIG. 1 is a top view of a wafer 100 and dies 102 that may be included in an example semiconductor package, such as a mmW semiconductor package or IC package. The wafer 100 may be composed of semiconductor material and may include one or more dies 102 having circuitry. Each of the dies 102 may be a repeating unit of a semiconductor product. After the fabrication of the semiconductor product is complete, the wafer 100 may undergo a singulation process in which the dies 102 are separated from one another to provide discrete "chips." The die 102 may include one or more transistors (e.g., some of the transistors 206 of FIG. 2, discussed below), supporting circuitry to route electrical signals to the transistors, passive components (e.g., traces, resistors, capacitors, inductors, and/or other circuitry), and/or any other components. Further detail regarding the particular structure of example capacitors as constructed in accordance with teachings disclosed herein is provided below in connect with FIGS. 2-14.

In some examples, the die 102 may include and/or implement a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuitry. Multiple ones of these devices may be combined on a single die 102. For example, a memory array formed by multiple memory circuits may be formed on a same die 102 as programmable circuitry (e.g., example processor circuitry 1802 of FIG. 18) or other logic circuitry. Such memory may store information for use by the programmable circuitry.

Figure 2:
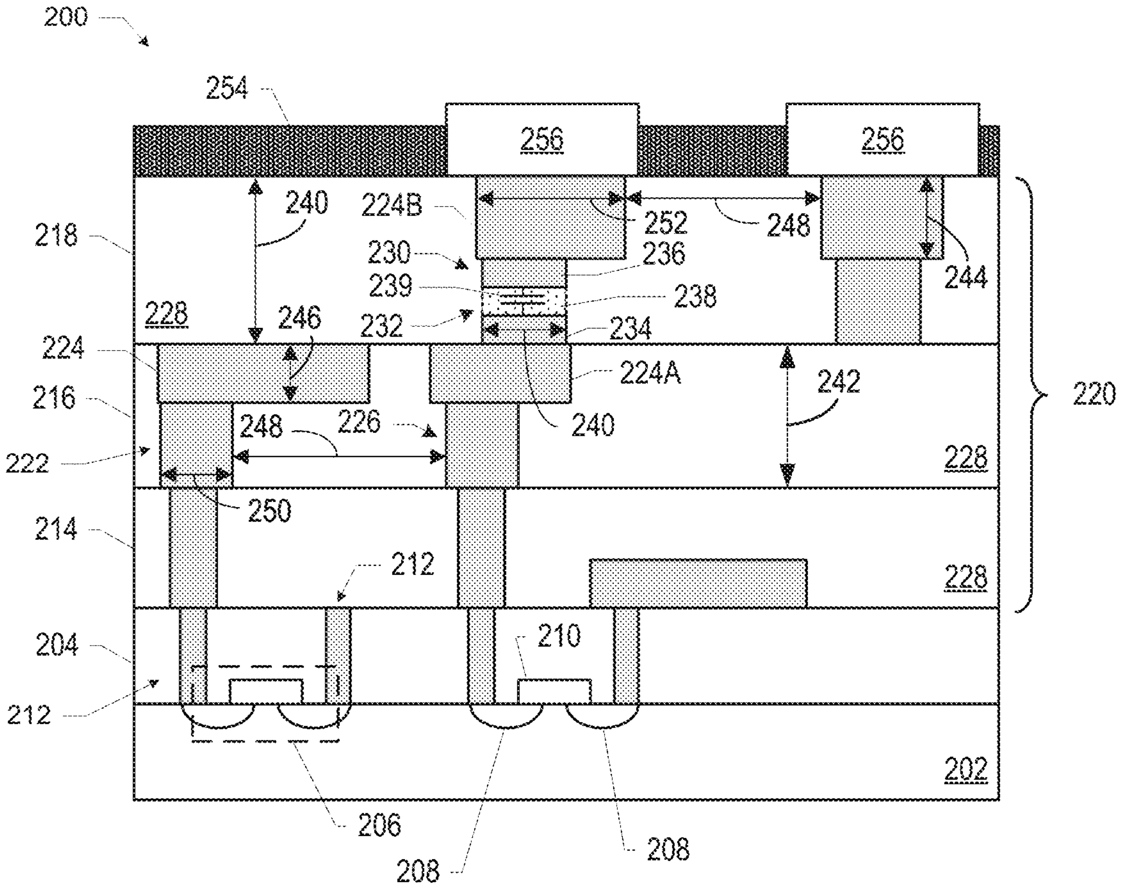
FIG. 2 is a cross-sectional side view of an example IC device including an example capacitor constructed in accordance with teachings disclosed herein.

FIG. 2 is a cross-sectional side view of an IC device 200 that may be included in an example IC package, such as an example mmW semiconductor package. One or more of the IC devices 200 may be included in one or more dies 102 (FIG. 1). The IC device 200 may be fabricated on a die substrate 202 (e.g., the wafer 100 of FIG. 1) and may be included in a die (e.g., the die 102 of FIG. 1). The die substrate 202 may be a semiconductor substrate composed of semiconductor material systems including, for example, n-type or p-type materials systems (or a combination of both). The die substrate 202 may include, for example, a crystalline substrate formed using a bulk silicon or a silicon-on-insulator (SOI) substructure. In some examples, the die substrate 202 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 202. Although a few examples of materials from which the die substrate 202 may be formed are described here, any material that may serve as a foundation for an IC device 200 may be used. The die substrate 202 may be part of a singulated die (e.g., the die 102 of FIG. 1) or a wafer (e.g., the wafer 100 of FIG. 1).

The IC device 200 may include one or more device layers 204 disposed on or above the die substrate 202. The device layer 204 may include features of one or more transistors 206 (e.g., metal oxide semiconductor field-effect transistors (MOSFETs)) formed on the die substrate 202. The device layer 204 may include, for example, one or more source and/or drain (S/D) regions 208, a gate 210 to control current flow between the S/D regions 208, and one or more S/D contacts 212 to route electrical signals to/from the S/D regions 208. The transistors 206 may include additional features not depicted for the sake of clarity, such as device isolation regions, gate contacts, and the like. The transistors 206 are not limited to the type and configuration depicted in FIG. 2 and may include a wide variety of other types and/or configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 206 may include a gate 210 formed of at least two layers, a gate dielectric and a gate electrode. The gate dielectric may include one layer or a stack of layers. The one or more layers may include silicon oxide, silicon dioxide, silicon carbide, and/or a high-k dielectric material (e.g., a dielectric material having a high dielectric constant). The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 206 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 206 along the source-channel-drain direction, the gate electrode may consist of a U-shaped structure that includes a bottom portion substantially parallel to the surface of the die substrate 202 and two sidewall portions that are substantially perpendicular to the top surface of the die substrate 202. In other examples, at least one of the metal layers that form the gate electrode may simply be a planar layer that is substantially parallel to the top surface of the die substrate 202 and does not include sidewall portions substantially perpendicular to the top surface of the die substrate 202. In other examples, the gate electrode may consist of a combination of U-shaped structures and planar, non-U-shaped structures. For example, the gate electrode may consist of one or more U-shaped metal layers provided atop one or more planar, non-U-shaped layers.

In some examples, a pair of sidewall spacers may be provided on opposing sides of the gate stack to bracket the gate stack. The sidewall spacers may be formed from materials such as silicon nitride, silicon oxide, silicon carbide, silicon nitride doped with carbon, and silicon oxynitride. Processes for providing sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack. In some examples, transistor gate capacitance is provided in the gate stack. However, the resistance in the gate stack limits the use of the transistor gate capacitance as a capacitor for the IC device 200. Further, the transistor gate shows an unwanted bias dependence when used as a capacitor.

The S/D regions 208 may be formed within the die substrate 202 adjacent to the gate 210 of each transistor 206. The S/D regions 208 may be formed using an implantation/diffusion process or an etching/deposition process, for example. In the former process, dopants such as boron, aluminum, antimony, phosphorous, or arsenic may be ion-implanted into the die substrate 202 to form the S/D regions 208. An annealing process that activates the dopants and causes them to diffuse farther into the die substrate 202 may follow the ion-implantation process. In the latter process, the die substrate 202 may first be etched to form recesses at the locations of the S/D regions 208. An epitaxial deposition process may then be carried out to fill the recesses with material that is used to fabricate the S/D regions 208. In some implementations, the S/D regions 208 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 208 may be formed using one or more alternate semiconductor materials such as germanium or a group III-V material or alloy. In further examples, one or more layers of metal and/or metal alloys may be used to form the S/D regions 208.

Electrical signals, such as power and/or input/output (I/O) signals, may be routed to and/or from the devices (e.g., transistors 206) of the device layer 204 through one or more interconnect layers disposed on the device layer 204 (illustrated in FIG. 2 as interconnect layers 214-218). For example, electrically conductive features of the device layer 204 (e.g., the gate 210 and the S/D contacts 212) may be electrically coupled with interconnect structures 222 of the interconnect layers 214-218. The one or more interconnect layers 214-218 may form a metallization stack (also referred to as an "ILD (inter-layer dielectric) stack") 220 of the IC device 200.

The interconnect structures 222 may be arranged within the interconnect layers 214-218 to route electrical signals according to a wide variety of designs (in particular, the arrangement is not limited to the particular configuration of interconnect structures 222 depicted in FIG. 2). In other words, the interconnect structures 222 show routing that may be manufactured during a BEOL process. Although a particular number of interconnect layers 214-218 is depicted in FIG. 2, examples of the present disclosure include IC devices having more or fewer interconnect layers than depicted.

As illustrated in FIG. 2, the interconnect structures 222 include example metal interconnects 224 (e.g., lines, interconnect wires, metal layers, etc.) and example first vias 226 (e.g., conductive vias, electrical vias, etc.). The interconnect structures 222 of the illustrated example define signal traces (e.g., signaling lines) to transfer signals or information between various components (e.g., transistors, capacitors, resistors, backend layers, etc. and/or other circuitry) of the IC device 200 and/or power traces for transferring or carrying power to the various components of the IC device 200. The metal interconnects 224 may be arranged to route electrical signals in a direction of a plane that is substantially parallel with a surface of the die substrate 202 upon which the device layer 204 is provided. For example, the metal interconnects 224 may route electrical signals in a direction in and out of the page from the perspective of FIG. 2.

The interconnect layers 214-218 may include an example first dielectric material 228 (e.g., an inter-metal dielectric material) disposed between the interconnect structures 222, as shown in FIG. 2. In some examples, the first dielectric material 228 disposed between the interconnect structures 222 in different ones of the interconnect layers 214-218 may have different compositions. In other examples, the composition of the first dielectric material 228 between different interconnect layers 214-218 may be the same. In some examples, an interconnect layer 214-218 can include multiple layers of the first dielectric material 228 between adjacent ones of the metal layers associated with metal interconnect 224. That is, in some examples, ones of the vias 226, 230 extend through multiple layers of the dielectric material. In some examples, the first dielectric material 228 provides electrical insulation between the interconnect structures 222. The first dielectric material 228 may be associated with a first dielectric constant (κ) or relative permittivity (ε) that is relatively low. In particular, a value of the first dielectric constant (κ) or relative permittivity (ε) of the first dielectric material 228 is selected such that the first dielectric material 228 prevents or otherwise reduces electrical coupling between ones of the interconnect structures 222.

The first vias 226 extend through the first dielectric material 228 between electrically conductive components. The first vias 226 are lined or filled with an electrically conductive material such as a metal to provide an electrical connection between different metal interconnects 224 in different layers. The first vias 226 may be arranged to route electrical signals in a direction of a plane that is substantially perpendicular to the surface of the die substrate 202 upon which the device layer 204 is provided. The first vias 226 extend through the first dielectric material 228 and electrically interconnect conductive layers of different build-up layers. For example, the first vias 226 may electrically couple metal interconnects 224 of different interconnect layers 214-218 together.

The IC device 200 includes an example second via 230, in which an example capacitor structure 232 is provided in accordance with teachings of this disclosure. Although the IC device 200 of the illustrated example includes a single capacitor structure 232, the IC device 200 can include a plurality of capacitor structures 232. Further, the capacitor structure(s) 232 are not limited to being in the uppermost interconnect layer 218 (as shown) but may be in any one of the different interconnect layers 214-218. In some examples, different capacitor structures 232 are positioned in different ones of the interconnect layers 214-218.

Similar to the first vias 226, the second via 230 extends through the first dielectric material 228. That is, the second via 230 is in a layer of the first dielectric material 228 provided in an interconnect layer 214-218. The capacitor structure 232 is provided in the second via 230. The first vias 226 are structurally, visually, and operationally different that the second vias 230. Whereas the first vias 226 are lined or filled with metal to provide an electrically conduct path between the metal interconnects 224 of adjacent interconnect layers 214-218, the second via 230 includes the capacitor structure 232 to provide capacitance between the metal interconnects 224 of adjacent interconnect layers 214-218.

The capacitor structure 232 is positioned between an example first metal interconnect 224A and an example second metal interconnect 224B that is adjacent the first metal interconnect 224A. The capacitor structure 232 includes an example first (e.g., bottom) electrode layer 234 and an example second (e.g., top) electrode layer 236. In some examples, the first electrode layer 234 is excess metal that is built up from (e.g., extends from, protrudes from) the first metal interconnect 224A. In some examples, the first electrode layer 234 is implemented by the first metal interconnect 224A (e.g., without excess metal extending into the via 230). In some examples, the first electrode layer 234 may be separate from and deposited onto the first metal interconnect 224A. In some examples, the second electrode layer 236 is implemented by the second metal interconnect 224B (e.g., without excess metal extending into the via 230). In some examples, the second electrode layer 236 may be separate from the first metal interconnect 224A. In some examples, fabricating the capacitor structure 230 such that at least one of the electrode layers 234, 236 extends into the second via 230 (e.g., from at least one end of the second via 230) reduces a distance between facing surfaces of electrode layers 234, 236, which increases capacitance of the capacitor structure 230.

An example second dielectric material 238 is disposed between the first electrode layer 234 and the second electrode layer 236 to provide the capacitance therebetween. The second dielectric material 238 can include, but is not limited to, titanium dioxide, hafnium dioxide, hafnium zirconium oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, and/or any other suitable dielectric material(s) (e.g., non-conducting material (s) that stores electrical charges). The second dielectric material 238 can be selected independent of the first dielectric material 228. Thus, the second dielectric material 238 may be associated with a second dielectric constant (κ) or relative permittivity (ε). The second dielectric constant may be different than the first dielectric constant. In particular, in some examples, the second dielectric constant is higher than the first dielectric constant to produce a larger capacitance value than the first dielectric constant would provide. That is, the second dielectric material 238 transforms the second via 230 into a capacitor, which is represented by a capacitor symbol 239 between the two electrode layers 234, 236 in FIG. 2. In some examples, the second dielectric material 238 is selected based on materials used during a standard IC fabrication process. In some examples, the second dielectric material 238 is selected based on a specific application or implementation of the IC device 200.

In some examples, one or more of the first vias 226 may be replaced with the example capacitor structure 232 disclosed herein. For example, rather than electroplating the one or more of the first vias 226, an example capacitor structure 232 disclosed herein may be fabricated. In some such examples, different ones of the capacitor structures 232 can include different types of second dielectric materials (e.g., different dielectric materials having different second dielectric constant (κ) or relative permittivity (ε), both of which are larger than the first dielectric material associated with the first dielectric material 228). In some examples, fabrication of the capacitor structure 232 is done as part of the routing of the IC device 200. Further detail regarding the particular structure of example capacitors constructed in accordance with teachings disclosed herein is provided below in connection with FIGS. 3-14.

As illustrated in FIG. 2, a first interconnect layer 214 (referred to as Metal 1 or "M1") may be formed directly on the device layer 204. In some examples, the first interconnect layer 214 may include interconnect structures 222 (e.g., metal interconnects 224 and/or first vias 226), as shown. The metal interconnects 224 of the first interconnect layer 214 may be coupled with contacts (e.g., the S/D contacts 212) of the device layer 204. While not illustrated in examples disclosed herein, another metal layer (referred to as Metal 0 or "M0") may be formed between the device layer 204 and the first interconnect layer 214. For example, the metal layer can be electrically connected to the S/D contacts 212 and to the interconnect structures 222 (e.g., the interconnects 224 and/or the first vias 226) in the first metal layer 214 (e.g., by another via 226).

A second interconnect layer 216 (referred to as Metal 2 or "M2") may be formed directly on the first interconnect layer 214. In some examples, the second interconnect layer 216 may include first vias 226 to couple the metal interconnects 224 of the second interconnect layer 216 with the metal interconnects 224 of the first interconnect layer 214. Although the metal interconnects 224 and the first vias 226 are structurally delineated with a line within each interconnect layer (e.g., within the second interconnect layer 216) for the sake of clarity, the metal interconnects 224 and the first vias 226 may be structurally and/or materially contiguous (e.g., simultaneously filled during a dual-damascene process) in some examples.

A third interconnect layer 218 (referred to as Metal 3 or "M3") (and additional interconnect layers, as desired) may be formed in succession on the second interconnect layer 216 according to similar techniques and configurations described in connection with the second interconnect layer 216 or the first interconnect layer 214. In some examples, the interconnect layers that are "higher up" in the metallization stack 220 in the IC device 200 (i.e., farther away from the device layer 204) may be thicker with features and/or structures having a greater width and/or pitch than the interconnect layers "lower down" in the metallization stack 220. For example, the third interconnect layer 218 of FIG. 2 has a first thickness 240 that is larger than a second thickness 242 of the second interconnect layer 216. Further, the metal interconnects 224 of the third interconnect layer 218 include a first interconnect height 244 that is larger than a second interconnect height 246 of the metal interconnect 224 of the second interconnect layer 216. While not illustrated, the IC device 200 can include additional set(s) of interconnect layers larger than those illustrated herein. In some examples, the IC device 200 can be capped with a thick interconnect layer that is substantially bigger (e.g., multiple times bigger) than any layer below.

FIG. 2 illustrates an example spacing 248 between respective interconnect structures 222 in the same interconnect layer. In particular, FIG. 2 illustrates a first example spacing 248 between vias 226 in the second interconnect layer 216 and a second example spacing 248 between the metal interconnects 224 in the third interconnect layer 218. However, the spacing 248 can be defined between any two metal interconnects 224 and/or vias 226, 23 in the same interconnect layer 214-218. An example pitch can be defined for pair of metal interconnects 224 and/or vias 226, 230. For example, an example via pitch can be defined by a sum of an example diameter 250 of a via 226, 230 and a respective spacing 248 between the respective via 226, 230 and an adjacent via 226, 230. Similarly, an example interconnect pitch (e.g., line pitch) can be defined by a sum of an example width 252 of a metal interconnect 224, 224B (e.g., metal line) and a respective spacing 248 between the respective metal interconnect 224, 224B and an adjacent metal interconnect 224, 224B. In some examples, each interconnect layer 214-218 can be associated with a minimum via pitch and/or a minimum interconnect pitch. In some examples, the interconnect layers 214-218 higher up in the metallization stack 220 can be associated with a minimum via pitch and/or a minimum interconnect (line) pitch that is larger than a minimum via pitch and/or a minimum interconnect (line) pitch associated with lower interconnect layers 214-218.

In some examples, compositions of different ones of the interconnect layers 214-218 and/or the metal interconnects 224 may differ between different ones of the interconnect layers 214-218. For example, metal interconnects 224 in the first interconnect layer 214 can include copper having a cobalt capping layer, metal interconnects 224 in the second interconnect layer 216 can include copper having a manganese capping layer, and the metal interconnects 224 in the third interconnect layer 218 can include copper having an aluminum capping layer. In some examples, the aluminum capping layer may be patterned using a substrative manufacturing process rather than by damascening.

In some examples, first and/or second vias 226, 230 in the interconnect layers that are "higher up" in the metallization stack 220 (e.g., upper layers) may be associated with a larger diameter and/or a larger height, meaning the first and/or second vias 226, 230 in the upper layers may be larger. In some examples, an example diameter 250A of the second via 230 is proportional to a capacitance rating or capability (e.g., a measured unit) of the capacitor structure 232. For example, the larger the diameter 250A, the greater an amount of capacitance of the capacitor structure 232. As used herein, capacitance of the capacitor structure 232 means an amount of energy that the capacitor structure 232 can store (e.g., measured in units of Farad). Thus, capacitor structure 232 higher up in the metallization stack 220 may be associated with high capacitance but may introduce resistance. An aspect ratio of the second via 230 is defined as a ratio between the diameter 250A of the second via 230 and a height of the second via 230 (e.g., a distance between the first and second metal interconnects 224A, 224B). In some examples, one or more dimensions of the second via 230 can be determined based on a desired aspect ratio of the second via 230 and/or a desired capacitance provided by the capacitor structure 232 in the second via 230.

While the capacitor structure 232 of the illustrated example is in an upper interconnect layer 218 of the IC device 200, teachings disclosed herein are not limited thereto. Rather, placements of the second via(s) 230 and the capacitor structure(s) 232 can differ in different examples depending on the specific application for the IC device 200 and corresponding circuit needs of a given example. For example, the capacitor structure 232 may be fabricated where it well serves the circuit topology. For example, IC devices 200 for implementation at the mmW frequency may benefit from the capacitor structures 232 being in second vias 230 in the upper layers (e.g., farther from the device layer 204) to provide larger capacitance values. Other applications may benefit from the capacitor structures 232 being in second vias 230 lower in the metallization stack 220 (e.g., closer to the device layer 204), wherein denser metals are typically utilized, such as for tunable capacitors. In particular, example capacitor structures disclosed herein facilitate increased freedom in design and material.

The IC device 200 may include a solder resist material 254 (e.g., polyimide or similar material) and one or more conductive contacts 256 provided on the interconnect layers 214-218. In FIG. 2, the conductive contacts 256 are illustrated as taking the form of bond pads. The conductive contacts 256 may be electrically coupled with the interconnect structures 222 and configured to route the electrical signals of the transistor(s) 206 to other external devices. For example, solder bonds may be formed on the one or more conductive contacts 256 to mechanically and/or electrically couple a chip including the IC device 200 with another component (e.g., a circuit board). The IC device 200 may include additional or alternate structures to route the electrical signals from the interconnect layers 214-218; for example, the conductive contacts 256 may include other analogous features (e.g., posts) that route the electrical signals to external components.

Figure 3:
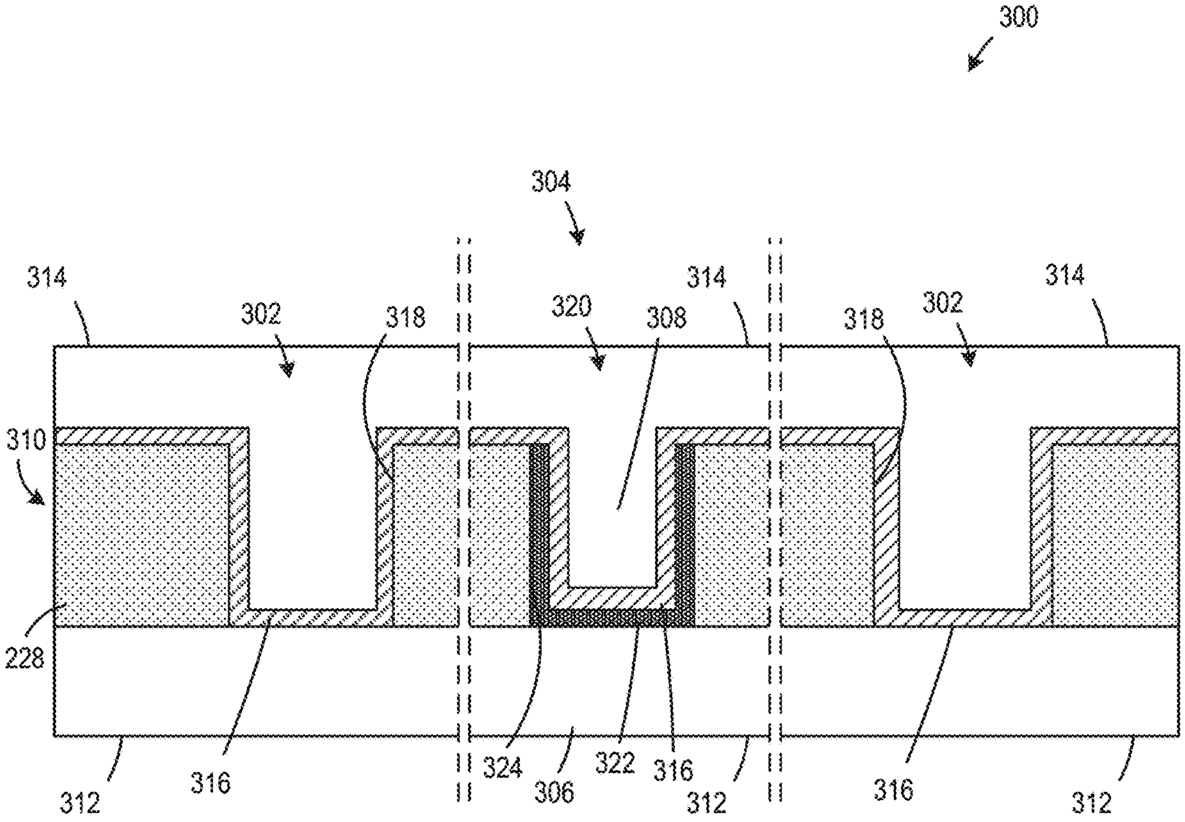
FIG. 3 is a cross-sectional view of a via structure and an example capacitor structure constructed in accordance with teachings disclosed herein.

FIG. 3 is a cross sectional side view of a portion of another example IC device 300 constructed in accordance with teachings of this disclosure. In particular, FIG. 3 illustrates first vias 302 (e.g., electrically conductive vias) and an example capacitor structure 304 fabricated in an example second via 320. The first vias 302 and the capacitor structure 304 of FIG. 3 appear to be adjacent to one another for the sake of simplicity and for illustrative purposes only. In particular, FIGS. 3-7 illustrate the capacitor structure 304 relative to the first vias 302 to demonstrate that the capacitor structure 304 can be realized with minor modifications to a standard via process of an IC fabrication process. In particular, the capacitor structure 304 can be realized with the addition of an example photolithography process.

As indicated by the dashed-line spaces, the first vias 302 and the capacitor structure 304 are separated in operation to enable electrical separation of an example first (e.g., bottom) electrode 306 and an example second (e.g., top) electrode 308 positioned adjacent the first electrode 306. In this example, the first electrode 306 corresponds to a first metal interconnect 312 below the second via 320 and the second electrode 308 corresponds to a protruding portion of the material of a second metal interconnect 314 above the second via 320. In this example, the first vias 302 are in the same interconnect layer (e.g., interconnect layer 214-218 of FIG. 2) as the capacitor structure 304, but electrically isolated from one another (e.g., via the first dielectric material 228 of FIG. 2). That is, in this example, the metal interconnects 312, 314 (above and below the vias 302 and the capacitor structure 304) do not extend continuously across the IC device 300 between the two first vias 302 and the capacitor structure 304.

Many of the components of the example IC device 300 of FIG. 3 are substantially similar or identical to the components described above in connection with the IC device 200 of FIG. 2. As such, those components will not be described in detail again below. Instead, the interested reader is referred to the above corresponding descriptions for a complete written description of the structure and operation of such components.

The first vias 302 are standard electrically conductive vias that include a conductive material (e.g., metal) that extends entirely through an example first (e.g., inter-metal) dielectric layer 310 disposed between the example first metal interconnect 312 and the example second metal interconnect 314, which is adjacent the first metal interconnect 312. The first metal interconnect 312 is electrically coupled to the second metal interconnect via the first vias 302. The first dielectric layer 310 may be formed of an example first dielectric material (e.g., first dielectric material 228 of FIG. 2).

The first vias 302 include an example barrier layer 316 (e.g., diffusion barrier, etc.) between the first metal interconnect 312 and the second metal interconnect 314. The barrier layer 316 is a layer of conductive material structured to prevent or reduce corruption between the first metal interconnect 312 and the second metal interconnect 314. For example, the barrier layer 316 can prevent diffusion and/or reaction between the first and second metal interconnects 312, 314.

In some examples, the barrier layer 316 directly engages or directly contacts the first metal interconnect 312 and the second metal interconnect 314. The first dielectric layer 310 also directly engages or directly contacts the barrier layer 316 along example walls 318 of the first vias 302. That is, as shown in the illustrated example, the barrier layer 316 lines the walls 318 of the first vias 302 and extends across the bottom of the first vias 302 (along an exposed surface of the first metal interconnect 312) with the material of second metal interconnect 314 extending into and filling the rest of the first vias 302. As a result, the barrier layer 316 provides direct electrical coupling of the first and second metal interconnects 312, 314 through the first vias 302.

Unlike with the first vias 302, the first and second metal interconnects 312, 314 are not directly electrically coupled by the capacitor structure 304. Instead, the first metal interconnect 312 is capacitively coupled to the second metal interconnect 314 via the capacitor structure 304. The capacitor structure 304 is disposed in the example second via 320 that extends through the first dielectric layer 310 disposed between the first and second metal interconnects 312, 314. In particular, the capacitor structure 304 is formed in an opened second via 320A (e.g., in the opening of a via before any other material is deposited therein).

In the illustrated example of FIG. 3, the first electrode 306 of the capacitor structure 304 is implemented by the first metal interconnect 312. The capacitor structure 304 includes an example second dielectric layer 322 disposed directly on (e.g., in contact with) the first metal interconnect 312. The second dielectric layer 322 also directly engages (e.g., is in contact with, lines) portions of the first dielectric layer 310 along an example wall 324 of the second via 320. That is, the second dielectric layer 322 extends from the first metal interconnect 312 towards the second metal interconnect 314. In some examples, the second dielectric layer 322 covers the bottom of the second vias 320 (e.g., the exposed portion of the first metal interconnect) without extending up the wall 324 of the second via 320.

The capacitor structure 304 includes the barrier layer 316 disposed between the second dielectric layer 322 and the second electrode 308. In this example, the barrier layer 316 in the second via 320 is the same as the barrier layer 316 in the first vias 302 and is deposited at all locations during the same fabrication process. In this example, the barrier layer 316 engages or couples to the second dielectric layer 322 and the second electrode 308. In particular, the barrier layer 316 directly engages or couples to the second dielectric layer 322 along portions of the second dielectric layer 322 that extend along the wall 324 of the second via 320.

The second electrode 308 of FIG. 3 extends from, and is electrically coupled with, the second metal interconnect 314, into the second via 320, and towards the second dielectric layer 322. More particularly, in this example, the second electrode 308 fills the remaining space within the second via 320 after the addition of the second dielectric layer 322 and the barrier layer 316. Inasmuch as the second electrode 308 extends into the opened second via 320 toward the first electrode 306, the second electrode 308 is in relatively close proximity to the first electrode 306. The second electrode 308 is electrically coupled to the second metal interconnect 314. In some examples, the second electrode 308 is formed of a same conductive material as (e.g., is an integral extension of) the second metal interconnect 314. In some examples, the second electrode 308 can alternatively be formed of another electrically conductive material that is different than an electrically conductive material of the second metal interconnect 314.

The first electrode 306 and the second electrode 308 are electrically isolated by the second dielectric layer 322, providing capacitance therebetween. The second dielectric layer 322 is formed of an example second dielectric material (e.g., second dielectric material 238 of FIG. 2), which is associated with a dielectric constant that is higher than a dielectric constant associated with the first dielectric material 228. The second dielectric layer 322 positioned between the first electrode 306 and the second electrode 308 provides capacitance between the first metal interconnect 312 and the second metal interconnect 314.

Figure 4:
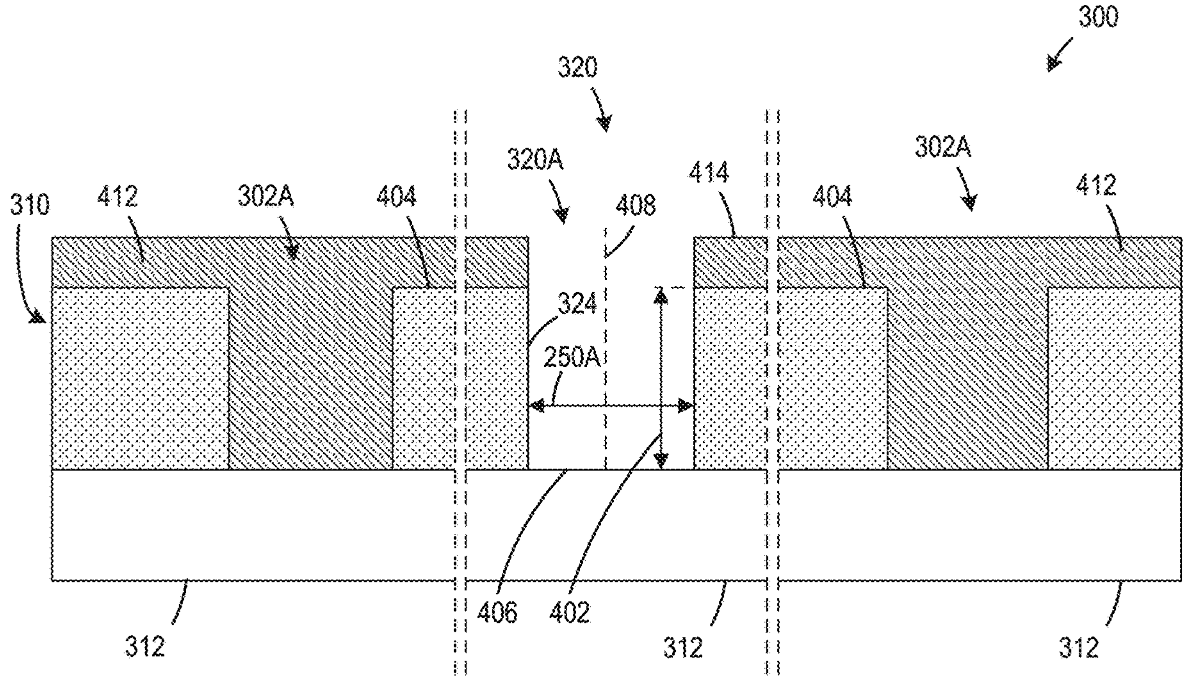
FIGS. 4-7 illustrate various stages of manufacture of the example capacitor structure of FIG. 3.

FIGS. 4-7 illustrate various stages of manufacture of the example capacitor structure 304 of FIG. 3. In particular, FIG. 4 is a cross-sectional side view of the IC device 300, illustrating the IC device 300 after a patterning (e.g., lithography) technique or process has been applied to expose or uncover the second via 320 for fabrication of the capacitor structure 304 while the first vias 302A remain covered by a resist material 412. In particular, after deposition of the first dielectric layer 310 on the first metal interconnect 312, opened first vias 302A and an opened second via 320A are fabricated in the first dielectric layer 310. Formation of the opened first and second vias 302A, 320A can be achieved by any appropriate process including, but not limited to, drilling (e.g., mechanical and/or laser drilling and subsequent cleaning), etching, chemical and/or mechanical polishing, and/or any other through via manufacturing techniques and/or any other semiconductor manufacturing process(es).

As illustrated in FIG. 4, the opened second via 320A is a cylindrical area or region having an example height 402 extending from a first (e.g., upper) surface 404 of the first dielectric layer 310 to a second (e.g., exposed) surface 406 of the first metal interconnect 312. The opened second via 320A has an example diameter (e.g., diameter 250A) defined by a distance across the opened second via 320A (parallel to the exposed surface 406 of the underlying first metal interconnect 312) that passes through a centerline 408 of the second via 320. That is, a radius of the opened second via 320A extends from the centerline 408 of the second via 320A to the wall 324 of the second via 320A. While the diameter 250A of the opened second via 320A of FIG. 4 is constant along the height 402 of the opened second via 320A, examples disclosed herein are not limited thereto. Rather, in some examples, the opened second via 320A can be a tapered cylinder in which the diameter 250A changes along the height 402 of the opened second via 320. In some examples, the first vias 302A have a similar size and shape to that of the second via 320

As illustrated in FIG. 4 and noted above, a resist material 412 has been deposited to cover or coat the first surface 404 of the first dielectric layer 310 and to fill the opened first vias 302A. The resist material 412 protects the first surface 404 of the first dielectric layer 310 and the opened first vias 302A during subsequent fabrication of the capacitor structure 304 (FIG. 3). A portion of the resist material 412 in the opened second via 320A has been removed to uncover or expose the opened second via 320A.

The resist material 412 can be exposed to a pattern of intense light using a photomask, which blocks the light adjacent the opened second via 320A and allows the light to contact the resist material 412 protecting the first surface 404 of the first dielectric layer 310 and the opened first vias 302A (or vice versa, depending on a type of the resist material 412 used). The portion of the resist material 412 in the opened second via 320A can be removed using any suitable process, such as etching (e.g., wet etching, dry etching, etc.), etc. Thus, the resist material 412 is removed from the opened second via 320A, but remains on the first surface 404 of the first dielectric layer 310 and the opened first vias 302A. In this example, the opened second via 320A extends from an exposed surface 414 of the resist material 412 to the exposed surface 406 of the first metal interconnect 312. In some examples, some of the resist material 412 on the first surface 404 immediately surrounding the second via 320 may also be removed.

Figure 5:
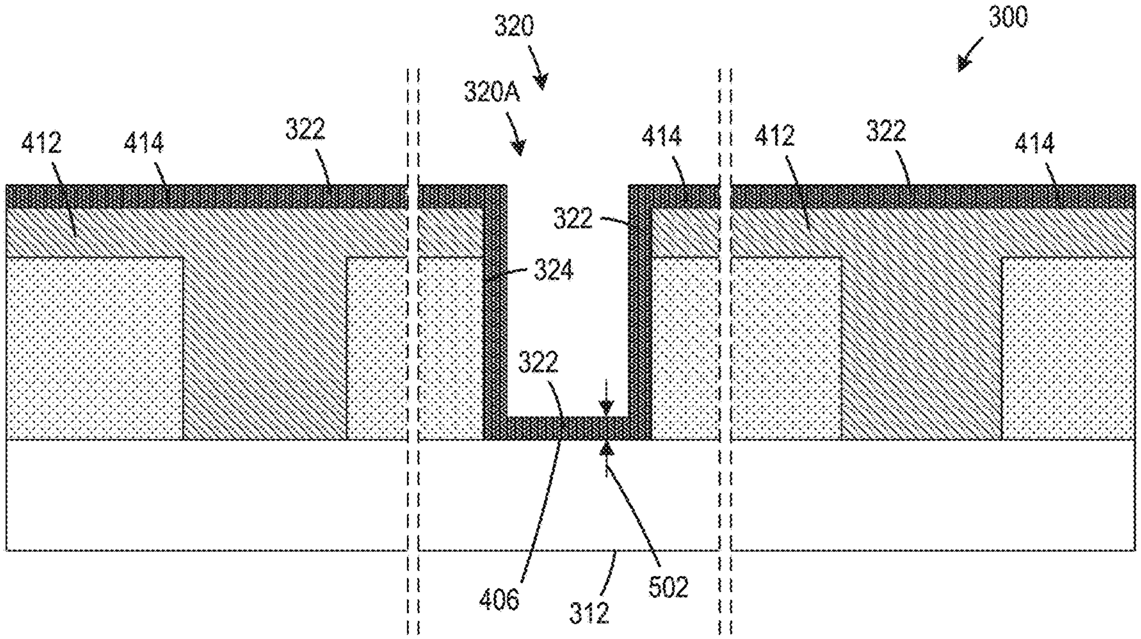

FIG. 5 is a cross-sectional view of the IC device 300 after deposition of the second dielectric layer 322. In particular, the second dielectric layer 322 has been deposited on exposed surfaces of the opened second via 320A, including on the exposed surface 406 of the first metal interconnect 312 and on the wall 324 of the second via 320. In this example, the second dielectric layer 322 is also deposited on the exposed surfaces 414 of the resist material 412. For example, the second dielectric layer 322 can be deposited across the IC device 300 to provide the second dielectric layer 322 in the opened second via 320A. In doing so, the second dielectric layer 322 is also deposited on the resist material 412.

The second dielectric layer 322 is to provide a layer of insulation between the first metal interconnect 312 corresponding to the first electrode 306 of the capacitor structure to be fabricated in the second via 320 and a subsequently deposited second electrode 308 for the capacitor structure. The second dielectric layer 322 is deposited until a desired thickness (t) 502 of the second dielectric layer 322 formed by the second dielectric material 322 is achieved. The thickness (t) 502 of the second dielectric layer 322 corresponds to a distance between the first and second electrodes 306, 308 (FIG. 3).

Figure 6:
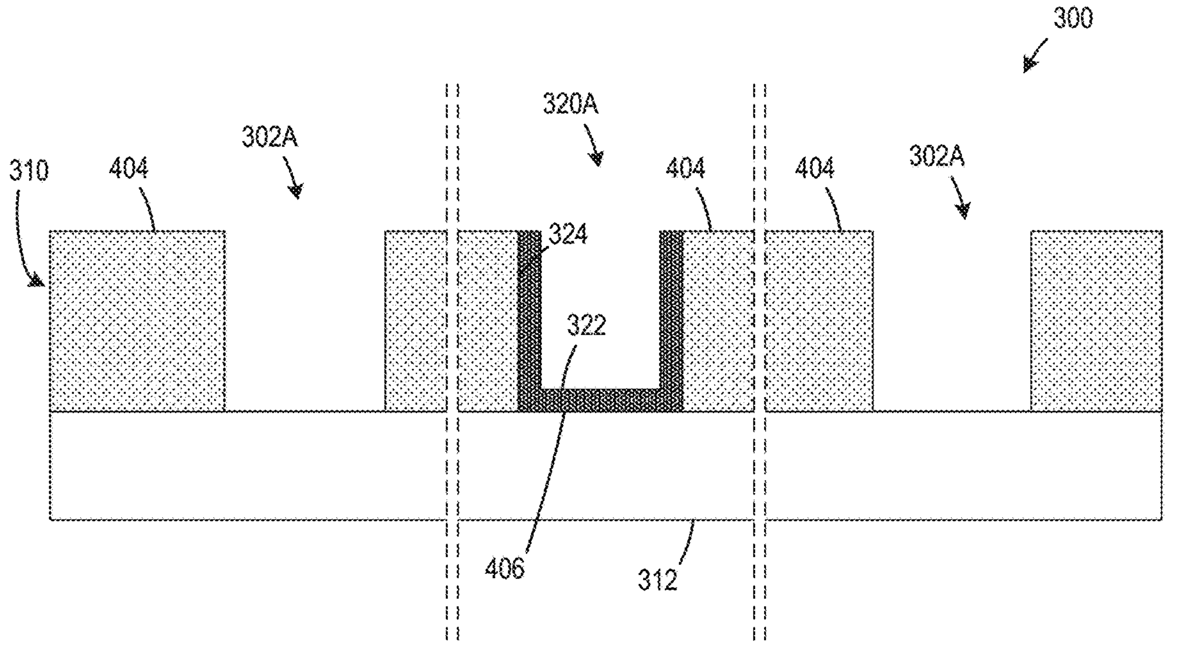

FIG. 6 is a cross-sectional side view of the IC device 300 after removal of the resist material 412 and portions of the second dielectric layer 322 in direct contact with the resist material 412. The resist material 412 and the second dielectric layer 322 can be removed via etching (e.g., wet etching, dry etching, etc.) and/or any other manufacturing process (es). As shown in the illustrated example, the removal of the resist material 412 exposes and/or uncovers the opened first vias 302A and the first surface 404 of the first dielectric layer 310. Further, as shown in FIG. 6, the remaining portion of the second dielectric layer 322 is limited to the extending along the wall 324 and the base (e.g., the second surface 406 of the first metal interconnect 312) of the opened second via 320A.

After deposition of the second dielectric layer 322 as detailed above, standard IC fabrications process to fill in the first and second vias 302, 320 and add another metal layer over the first dielectric material 310 may continue. For example, the standard IC fabrications process may include processes up to the deposition of the resist material 412 in FIG. 4, upon which disclosed examples can be implemented to fabricate the second dielectric layer 322 in the opened second via 320A.

Figure 7:
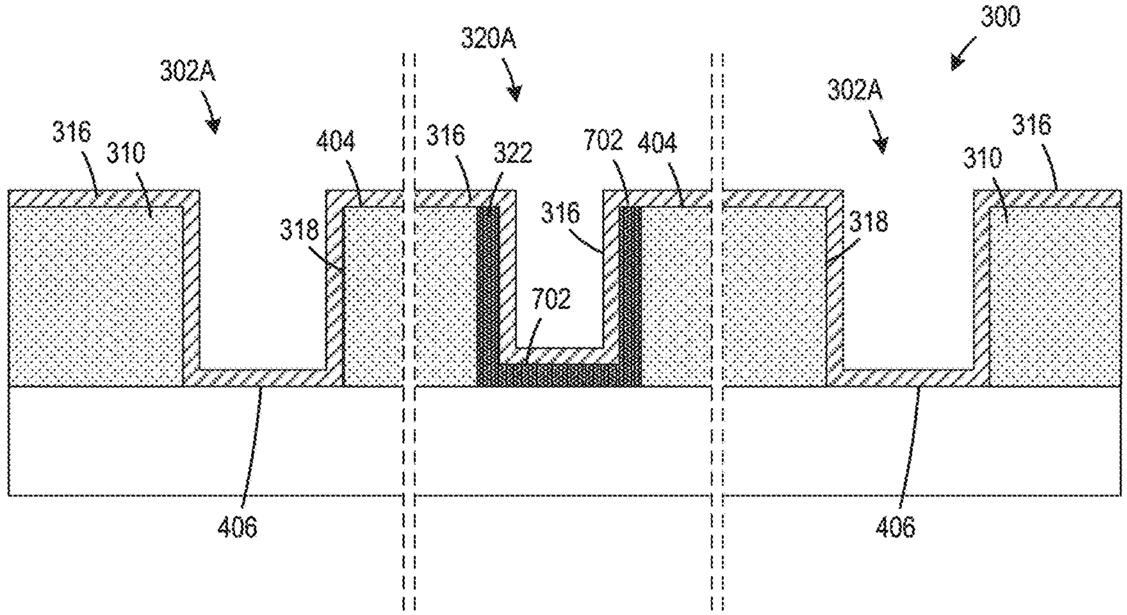

FIG. 7 is a cross-sectional side view of the IC device 300 after deposition of barrier material to provide the example barrier layer 316. The barrier layer 316 can be deposited using suitable deposition techniques for semiconductor devices. As illustrated in FIG. 7, the barrier layer 316 is deposited on all exposed surfaces of the assembly up to this stage of fabrication. Thus, the barrier layer 316 is deposited on the second surface 406 of the first metal interconnect 312 within each of the first vias 302, on the walls 318 of the first vias 302, across the first surface 404 of the first dielectric layer 310, and over exposed surface(s) 702 of the second dielectric layer 322. In some examples, the barrier layer 316 can be omitted. After the barrier layer 316 has been deposited, an electrically conductive material is deposited to fill remaining area in the opened second via 320A to provide the capacitor structure 304 in the second via 320 and define the second metal interconnect 314 as shown in FIG. 3.

Figure 8:
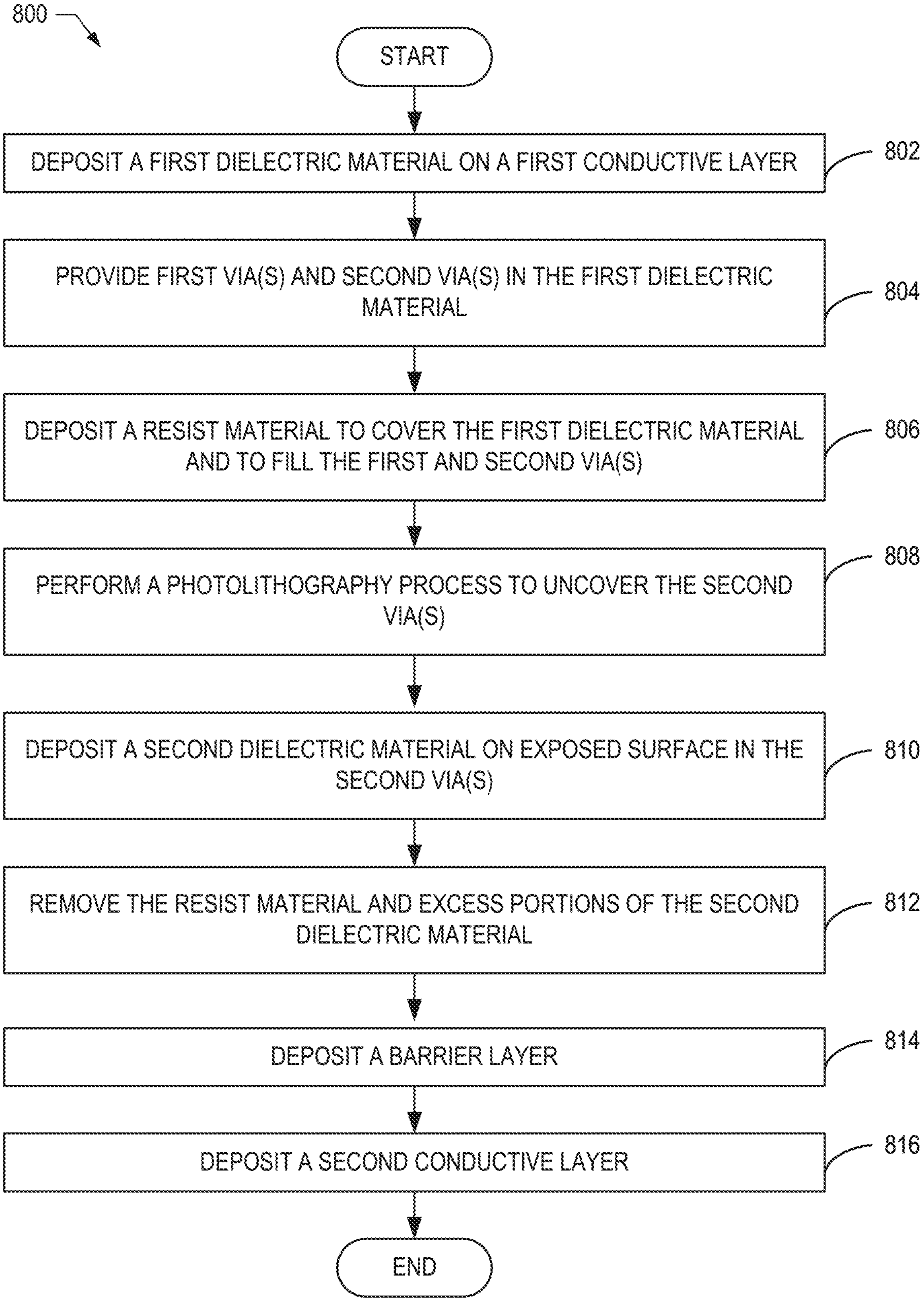
FIG. 8 is a flowchart representative of an example method of fabricating the example capacitor structure of FIG. 3 as represented by the example stages of manufacture shown in FIGS. 4-7.

FIG. 8 is a flowchart representative of an example method 800 of fabricating the example capacitor structure 302 of FIG. 3 as represented by the example stages of manufacture shown in FIGS. 4-7. The process begins with a first conductive layer (e.g., the first electrode 306 and/or the first metal interconnect 312 of FIG. 3) of an IC device (e.g., the IC device 300). In this example, the first metal interconnect 312 implements the first electrode 306.

At block 802, the method includes depositing a first dielectric material (e.g., the first dielectric material 228) on the first conductive layer 306, 312. In particular, one or more layers of the first dielectric material 228 are deposited on the first conductive layer 306, 312 to provide a first dielectric layer (e.g., first dielectric layer 310) of the IC device 300. The first dielectric material 228 is associated with a first dielectric constant (κ) or relative permittivity (ε) that is relatively low to prevent or otherwise reduce electrical coupling between routing components.

At block 804, the method includes providing one or more first via(s) (e.g., first via(s) 302) and one or more second via(s) (e.g., second via(s) 320) in the first dielectric material 228. In some examples, the first via(s) 302 may be omitted. That is, in some examples, both the first via(s) 302 and the second via(s) 320 can be used for capacitor structures. Stated differently, in some examples, at this stage in the process, both the first and second vias 302, 320 are the same or substantially the same.

At block 806, the method includes depositing a resist material (e.g., resist material 412) to cover the first dielectric material 228 and to fill the first and second via(s) 302, 320. The resist material 412 is deposited to protect or cover the first surface 404 of the first dielectric layer 310 and the first via(s) 302 during deposition of capacitor material(s). At block 808, the method includes performing a photolithography process to uncover the second via(s) 320. That is, the method includes removing a first portion(s) of the resist material 412 to present or expose the opened second via(s) 320A. Other portion(s) of the resist material 412 remain to protect or cover the remaining first dielectric material 228 and the opened first via(s) 302A.

At block 810, the method includes depositing a second dielectric material (e.g., second dielectric layer 322) on exposed surfaces in the opened second via(s) 320A. The second dielectric layer 322 is associated with a second dielectric constant (κ) or relative permittivity (ε) that is higher than the first dielectric constant (κ) or relative permittivity (€) (associated with the first dielectric material 228). The second dielectric layer 322 is selected to provide desired capacitance between two adjacent electrodes. During deposition of the second dielectric material 322, the second dielectric layer 322 is often provided on the resist material 412 due to the deposition technique(s).

At block 812, the method includes removing the resist material 412 and excess portions of the second dielectric material 322. In doing so, the second dielectric layer 322 deposited in block 810 remains only in the second via(s) 320.

At block 814, the method includes depositing a barrier layer (e.g., barrier layer 316). At block 816, the method includes depositing a second conductive layer. For example, the second conductive layer can be a second electrode (e.g., the second electrode 308 of FIG. 3), a metal interconnect 312, 314, etc.

The example method 800 of FIG. 8 can be iterated through for subsequent layers in the IC device 300. In some examples, the method 800 can be modified and/or included in a larger method to provide capacitor structures in different layers of an IC device 300. While an example method of manufacturing the example capacitor structures 304 of FIGS. 3-7 is illustrated in FIG. 8, one or more of the blocks in FIG. 8 may be combined, divided, re-arranged, omitted, eliminated, and/or implemented in any other way.

Figure 9:
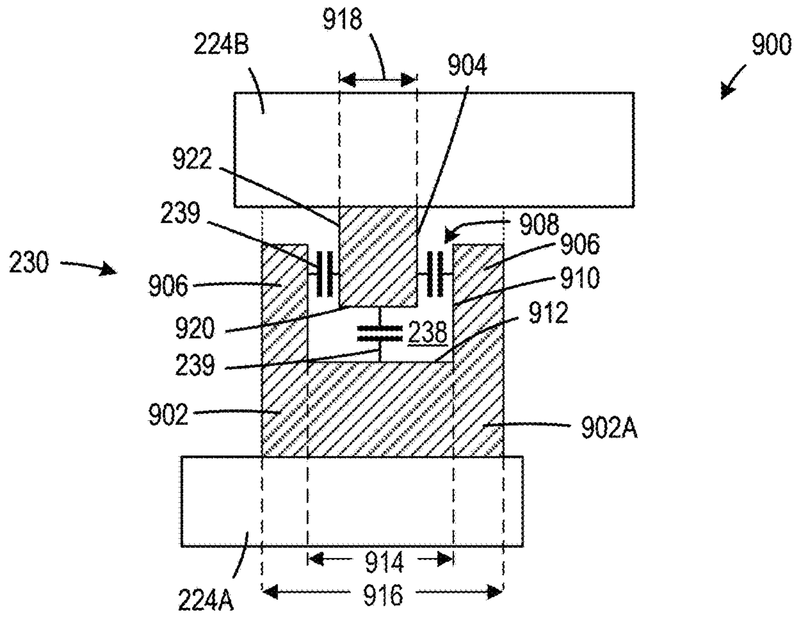
FIG. 9 illustrates another example capacitor structure disclosed herein.

FIG. 9 is a cross-sectional side view of another example capacitor structure 900 disclosed herein. The capacitor structure 900 of FIG. 9 is similar to the capacitor structure 232 of FIG. 2. For example, the capacitor structure 900 of FIG. 9 can be included in an example second via 230 of an example IC device (e.g., the IC device 200 of FIG. 2), which may be included in an example mmW semiconductor package. As such, the details of the parts of the capacitor structure 900 of FIG. 9 that are common with the parts of the capacitor structures 232 of FIG. 2 will not be described in detail again in connection with FIG. 9. Further, the same reference numbers used for structures shown in FIG. 2 will be used for similar or identical structures in FIG. 9.

A primary difference between the example capacitor structure 900 of FIG. 9 and the capacitor structure 232 of FIG. 2 is that the example capacitor structure 900 of FIG. 9 provides increased capacitance through an increase in the surface area of the two electrodes. The capacitor structure 900 of FIG. 9 includes an example first electrode layer 902 that can be built up from an example first metal interconnect (e.g., the first metal interconnect 224A) and an example second electrode layer 904 that can extend from an example second metal interconnect (e.g., the second metal interconnect 224B). An example second dielectric material (e.g., second dielectric material 238) is disposed in the second via 230 between the first and second electrode layers 902, 904. Unlike the first electrode layer 234 of FIG. 2, the first electrode layer 902 of FIG. 9 includes an example protrusion 906 (e.g., extension, flange, lip, rim, etc.) that extends from or directly contacts a base 902A of the first electrode layer 902. That is, the first electrode layer 902 is an electrically conductive cup- or vessel-like structure that includes an example cavity 908 (e.g., recess, socket, hollow core, etc.). The cavity 908 is defined by an example inner wall 910 (e.g., inner surface) and an example recessed surface 912 of the first electrode layer 902. The cavity 908 is associated with an example first diameter 914 that is less than an example second diameter 916 of the first electrode layer 902 (that corresponds to the diameter 250A of the second via 230).

The second electrode layer 904 is associated with an example third diameter 918, which is less than the first diameter 914 of the cavity 908. As illustrated in FIG. 9, the second electrode layer 904 extends at least partially into the cavity 908 of the first electrode layer 902. An example first surface 920 of the second electrode layer 904 is positioned adjacent, and substantially parallel with, the recessed surface 912 of the first electrode layer 902. Similarly, a portion of a second (e.g., circumferential) surface 922 (e.g., outer wall or surface) of the second electrode layer 904 is positioned adjacent a portion of the inner wall 910 of the first electrode layer 902. In some examples, a distance between the first surface 920 of the second electrode layer 904 and the recessed surface 912 of the first electrode layer 902 is approximately equal to a distance between the second surface 922 of the second electrode layer 904 and the inner wall 910 of the first electrode layer 902. In other examples, these distances may be different.

The second dielectric material 238 between the recessed surface 912 of the first electrode layer 902 and the first surface 920 of the second electrode layer 904 provides capacitance therebetween (represented by the capacitor symbol 239). Further, the second dielectric material 238 provides additional capacitance between the inner wall 910 of the first electrode layer 902 and the circumferential surface 922 of the second electrode layer 904. Thus, the capacitor structure 900 of FIG. 9 increases a surface area of a capacitor relative to the capacitor structure 232 of FIG. 2. Therefore, the capacitor structure 900 of FIG. 9 increases the capacitance that can be achieved in the second via 230.

Figure 10:
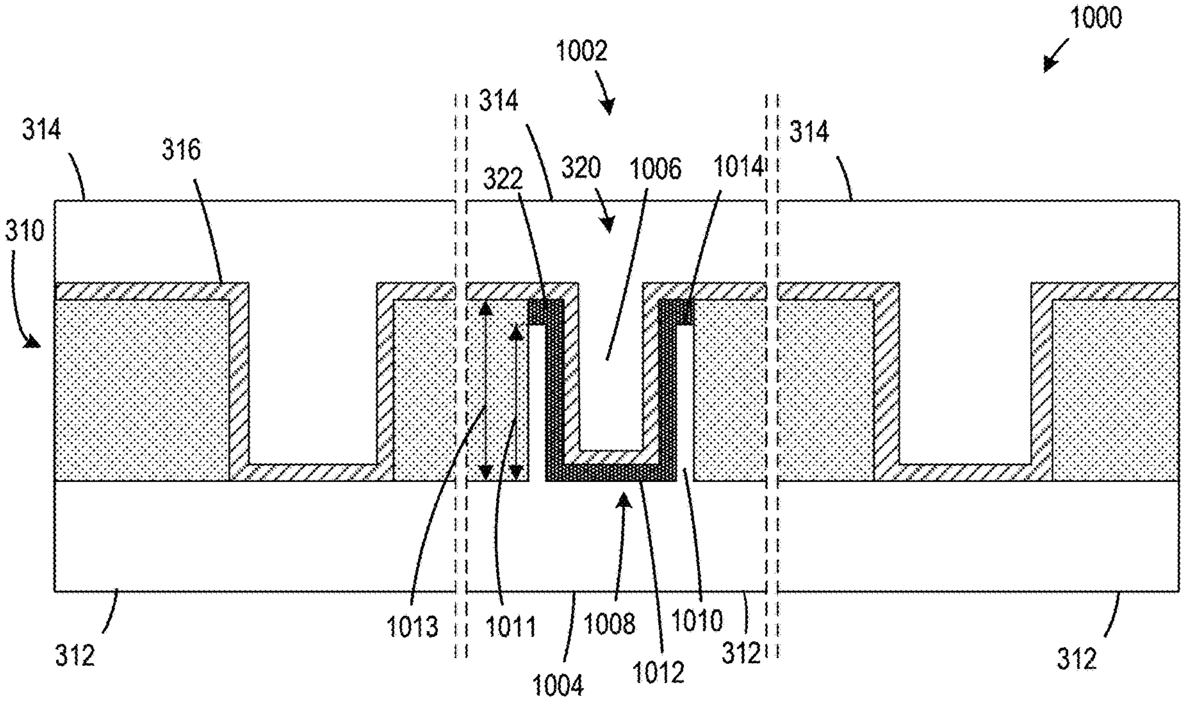
FIG. 10 illustrates a portion of another example IC device including an example implementation of the example capacitor structure of FIG. 9.

FIG. 10 is a cross sectional side view of an example IC device 1000 including an example capacitor structure 1002 structured in accordance with teachings of this disclosure. The capacitor structure 1002 of FIG. 10 is similar to the capacitor structure 304 of FIGS. 3-8. In particular, the primary difference between the capacitor structure 304 of FIGS. 3-8 and the capacitor structure 1002 of FIG. 10 is that the capacitor structure 1002 of FIG. 10 includes a cup- or vessel-like structure (similar to the capacitor structure 900 of FIG. 9). As such, the details of the parts of the IC device 300 and/or the capacitor structure 304 of FIGS. 3-8 and/or the capacitor structure 900 of FIG. 9 that are common with the parts of the IC device 1000 and/or the capacitor structure 1002 of FIG. 10 will not be described in detail again in connection with FIG. 10. Further, the same reference numbers used for structures shown in FIG. 10 will be used for similar or identical structures in FIGS. 3-8 and 9. Further, aspects of the example method 800 of FIG. 8 and represented by FIGS. 4-7 may be adapted for use in connection with the fabrication of the capacitor structure 1002 of FIG. 10.

The IC device 1000 of FIG. 10 includes example first and second metal interconnects 312, 314, which are adjacent one another and separated by an example first dielectric layer 310 formed of an example first dielectric material 228. Example first vias 302 and an example second via 320 are disposed in the first dielectric layer 310 between the first and second metal interconnects 312, 314. The example capacitor structure 1002 of FIG. 10 is provided in the second via 320.

The capacitor structure 1002 of FIG. 10 includes an example first (e.g., bottom) electrode 1004 and an example second (e.g., top) electrode 1006. Similar to the first electrode 306 of FIGS. 3-8, the first electrode 1004 corresponds to and/or is electrically coupled with the first metal interconnect 312 below the second via 320. However, the first electrode 1004 of FIG. 10 includes an example cavity 1008. In particular, the cavity 1008 is defined by an example inner wall 1010 (e.g., inner surface) extending or protruding from the first metal interconnect 312 and a surface region 1012 of the first metal interconnect 312 surrounded by the wall 1010. The inner wall 1010 protrudes away from the first metal interconnect 312 by a distance 1011, which is less than a thickness 1013 of the first dielectric layer 310. That is, the inner wall 1010 protrudes the distance 1011 away from the first metal interconnect 312 such that the inner wall 1010 does not electrically couple the first and second metal interconnects 312, 314.

The capacitor structure 1002 includes the example second dielectric layer 322, which is disposed in the cavity 1008. In particular, the second dielectric layer 322 is disposed directly on (e.g., in contact with) the wall 1010, including an example rim 1014 of the wall 1010, and the surface region 1012 of the first metal interconnect 312 surrounded by the wall 1010. The capacitor structure 1002 of FIG. 10 also includes the example barrier layer 316, which is at least partially disposed in the cavity 1008 between the second dielectric layer 322 and the second electrode 1006.

The cavity 1008 is associated with a first diameter that is greater than a second diameter of the second electrode 1006. As such, the second electrode 1006, which extends from and is electrically coupled with the second metal interconnect 314, can protrude into the cavity 1008 of the first electrode 1004. More particularly, in this example, the second electrode 1006 fills the remaining space within the cavity 1008 after the addition of the second dielectric layer 322 and the barrier layer 316.

The first electrode 1004 and the second electrode 1006 are electrically isolated by the second dielectric layer 322, providing capacitance therebetween. Due to the inner wall 1010 of the first electrode 1004 surrounding the second electrode 1006, the capacitor structure 1002 of FIG. 10 can provide increased capacitance relative to the capacitor structure 304 of FIGS. 3-8. Further, aspects of the example method 800 of FIG. 8 and represented by FIGS. 4-7 may be adapted for use in connection with the fabrication of the capacitor structure 1002 of FIG. 10. In particular, the method of FIG. 8 can be applied to fabricate or manufacture the capacitor structure 1002 of FIG. 10 with additional operations to fabricate the inner wall 1010 that define the cavity 1008.

The inner wall 1010 can be fabricated using any one or more suitable techniques to generate an electrically conductive protrusion. In some examples, the inner wall 1010 can be fabricated by applying a lining or coating to the opened second via 320A. In some examples, the inner wall 1010 can be fabricated by at least partially filling the opened second via 320A (e.g., to a desired depth corresponding to a desired height of the inner wall 1010) with an electrically conductive material, followed by a removal process (e.g., etching) to generate a bore corresponding to the cavity 1008. In still other examples, the inner wall 1010 can be fabricated by applying another photolithography technique.

Figure 11:
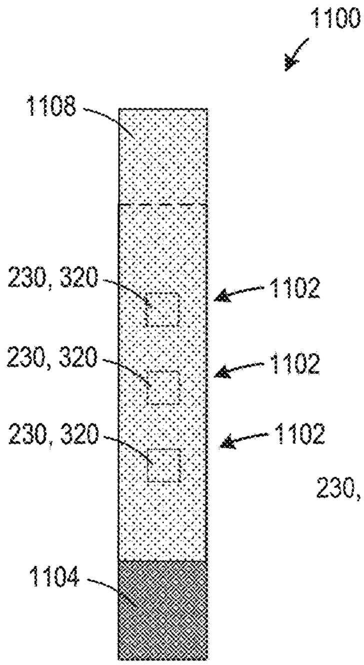
FIG. 11 illustrates another example capacitor structure disclosed herein.
Figure 12:
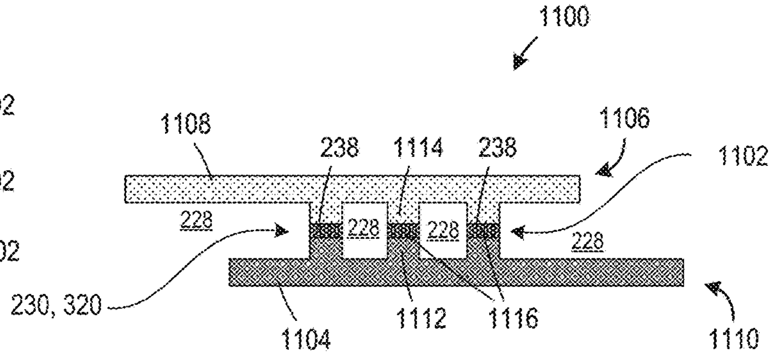
FIG. 12 is a side view of the example capacitor structure of FIG. 11.

FIGS. 11-12 illustrate a portion of another example IC device 1100, including a series of example capacitor structures 1102 structured in accordance with teachings of this disclosure. In particular, FIG. 11 is a top view of the IC device 1100 and FIG. 12 is a side view of the IC device 1100. Traditional finger capacitors include finger structures in a same interconnect level that are interleaved and interdigital with one another. When a dielectric material is provided between the finger structures, parasitic capacitance of a corresponding IC device can increase dramatically.

Referring to FIGS. 11 and 12, the IC device 1100 includes an example first finger structure 1104 (e.g., first metal interconnect) in a first metal layer 1106 of the IC device 1100 and an example second finger structure 1108 (e.g., second metal interconnect) in a second metal layer 1110 of the IC device 1100. The first finger structure 1104 is positioned below the second finger structure 1108, but can alternatively be positioned above the second finger structure 1108. The first and second finger structures 1104, 1108 are formed of an electrically conductive material. Further, the first and second finger structures 1104, 1108 are substantially parallel relative to one another.

The IC device 1100 of FIGS. 11-12 include first dielectric material (e.g., the first dielectric material 228) disposed between the finger structures 1104, 1108. Further, the IC device 1100 includes example vias (e.g., second vias 230, 320), which extend through the first dielectric material 228 between the first finger structure 1104 and the second finger structure 1108. As illustrated in FIG. 12, the example capacitor structures 1102 are provided between the first and second finger structures 1104, 1108. The series or array of capacitor structures 1102 operate similar to a capacitor bank with multiple capacitors arranged in parallel.

The capacitor structures 1102 includes example first electrodes 1112 electrically coupled to the first finger structure 1104 and example second electrodes 1114 electrically coupled to the second finger structure 1108. In particular, the first electrodes 1112 extend into the second vias 230, 320 (e.g., from the first finger structure 1104 towards the second finger structure 1108 positioned in the second vias 230, 320). Similarly, the second electrodes 1114 extend into the second vias 230, 320 (e.g., from the second finger structure 1108 towards the first finger structure 1104). To provide capacitance between the first and second electrodes 1112, 1114, the capacitor structure 1102 includes example second dielectric material (e.g., the second dielectric material 238) disposed between the first electrodes 1112 and respective second electrodes 1114. The second dielectric material 238 forms example second dielectric layers 1116 between the first and second electrodes 1112, 1114.

In other words, the capacitor structures 1102 are provided by the second dielectric layers 1116 between respective first and second electrodes 1112, 1114 in respective second vias 230, 320, avoiding the need to provide capacitance using the first dielectric material 228 that electrically decouples the first and second finger structures 1104, 1108. In this case, routing density in the BEOL of the IC device 1100 can be at least partially alleviated using the capacitor structure(s) 1102 of FIGS. 11-12, facilitating a reduction in an amount of parasitic capacitance provided by the finger structures 1104, 1108 (relative to traditional finger capacitors).

While three capacitor structures 1102 are illustrated between the first and second finger structures 1104, 1108, disclosed examples are not limited thereto. Rather, the IC device 1100 can include less than three or more than three capacitor structures 1102 in respective second vias 230, 320 between the first and second finger structures 1104, 1108. Further, the particular structure of the electrodes 1112, 1114 and the second dielectric material 238 can differ from what is shown in the illustrated example. For instance, in some examples, any of the capacitor structures 1102 can be implemented in a same or similar manner as any of the capacitor structures 232, 304, 900, 1002 shown in FIGS. 2, 3, 9, and/or 10.

Figure 13:
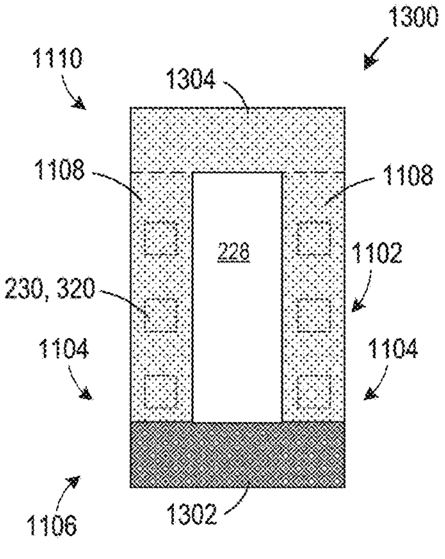
FIG. 13 illustrates another example capacitor structure disclosed herein.

FIG. 13 is a top view of another example IC device 1300 structured in accordance with teachings of this disclosure. The IC device 1300 is similar to the IC device 1100 of FIGS. 11-12. However, the IC device 1300 of FIG. 13 includes additional finger structures. In particular, the IC device 1300 includes two first finger structures 1104 in the first metal layer 1106, which are electrically coupled via an example metal line 1302 to form a comb-like structure. Similarly, the IC device 1300 includes two second finger structures 1108 in the second metal layer 1110, which are electrically coupled via another example metal line 1304 to form another comb-like structure. Each comb-line structure is contained in a same respective plane (e.g., the same metal layer), and different planes are substantially parallel relative to one another. Example capacitor structures (e.g., the capacitor structures 1102) are provided between respective ones of the first and second finger structures 1104, 1108.

Figure 14:
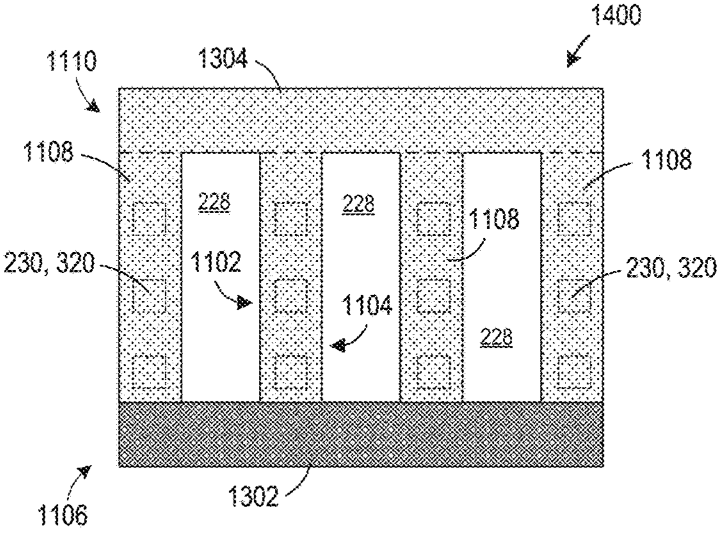
FIG. 14 illustrates yet another example capacitor structure disclosed herein.

FIG. 14 is a top view of another example IC device 1400 structured in accordance with teachings of this disclosure. The IC device 1400 is similar to the IC device 1300 of FIG. 13. However, the IC device 1400 of FIG. 14 includes four first finger structures 1104 in the first metal layer 1106, which are electrically coupled via the example metal line 1302 and four second finger structures 1108 in the second metal layer 1110, which are electrically coupled via another example metal line 1304. The example capacitor structures 1102 are provided between respective ones of the first and second finger structures 1104, 1108. While FIGS. 12-14 show different numbers of finger structures 1104, 1108, any other suitable number (e.g., 3, 5, 6, etc.) of finger structures may be implemented. Further, in some examples, the different finger structures can be interconnected in ways other than a comb-like structure (e.g., with all the fingers branching off a single line 1304 in the same direction). For instance, in some examples, finger structures may branch off both sides of the line 1302, 1304 in opposite directions. In some examples, both ends of the finger structures are connected by a line 1302, 1304 (rather than simply one end). In some examples, a first adjacent pair of finger structures are electrically coupled at one end and then a next adjacent pair of finger structures are connected at the other end. Any other arrangement of the finger structures is possible. Further, in some examples, capacitor structures 1102 are positioned along the line 1302, 1304 electrically coupling different ones of the finger structures.

Figure 15:
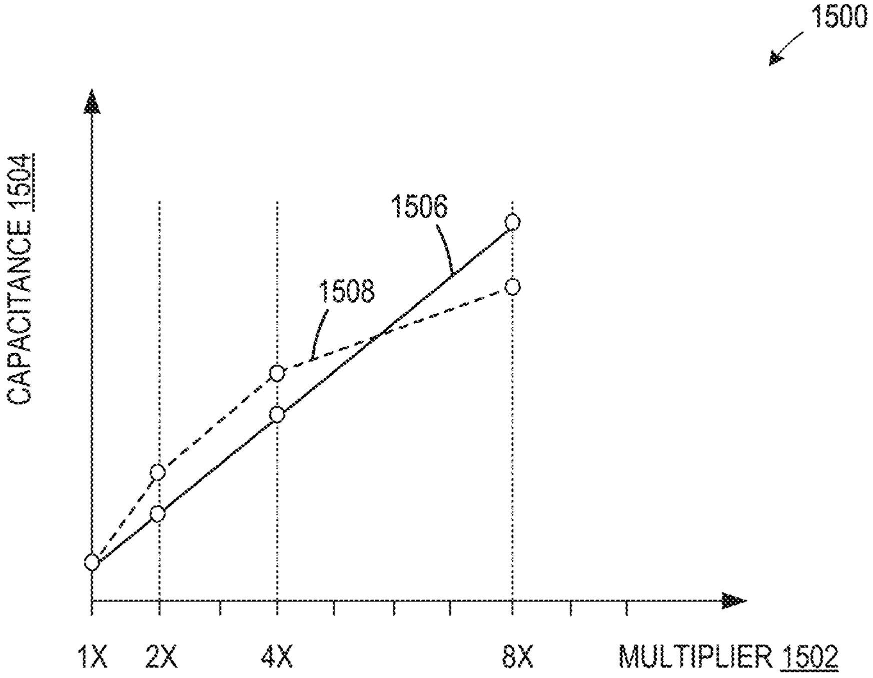
FIG. 15 is a graph showing the capacitance of traditional finger capacitors with different numbers of fingers relative to the capacitance of example capacitors constructed in accordance with FIGS. 11-14.

FIG. 15 is a graph 1500 showing the capacitance of traditional finger capacitors with different numbers of finger structures relative to the capacitance of example capacitor structures constructed in accordance with FIGS. 11-14. The graph includes an x-axis 1502 representing a "multiplier" that corresponds to an amount of finger structures 1104, 1108 that are connected to a line 1302, 1304. The graph includes a y-axis 1504 representing a capacitance (e.g., amount or value of capacitance provided between the finger structures 1104, 1108).

As illustrated in FIG. 15, a first line 1506 represents capacitive behavior of traditional finger structures relative to the amount of traditional finger structures. In particular, FIG. 15 illustrates an increase in capacitance 1504 provided by in increased multiple 1502 of traditional finger capacitors. That is, increasing an amount of traditional finger structures can introduce parasitic capacitance that can significantly affect a capacitance 1504 for the finger structures. As a result, the capacitance 1504 associated with the traditional finger capacitors does not scale linearly with the multiplicity (e.g., the first line 1506 is not linear). This non-linearity needs to be compensated with additional trimming circuits which can add cost to the fabrication of IC devices containing such traditional finger structures.

The graph of FIG. 15 includes a second line 1508 representing capacitive behavior of finger structures capacitively coupled by capacitor structures 1102 within vias extending between the finger structures as disclosed herein. As represented by the line 1508, such finger structures will scale linearly with the multiplicity. That is, an increase in the amount of finger structures (and a corresponding increase in the number of capacitor structures 1102) disclosed herein results in a corresponding increase in the capacitance 1504. That is, the capacitor structures 1102 disclosed herein reduce or minimize routing contribution to the wiring, facilitating the linear relationship between finger structure multiplicity and capacitive behavior.

In some examples, the capacitor structures 1102 disclosed herein can be utilized in digital tunable capacitors, allowing capacitance therein to scale ideally with the number of finger structures 1104, 1108 disclosed herein connected to a line 1302, 1304. As noted above, the series or array of capacitor structures 1102 operate similar to a capacitor bank with multiple capacitors arranged in parallel. That is, the capacitor structures 1102 provided between the finger structures 1104, 1108 enable linear scaling of capacitance with the multiplicity of the finger structures 1104, 1108. The capacitor structures 1102 disclosed herein thus facilitate linearity in a capacitor bank without design overhead.

Although each example capacitor structure 232, 304, 900, 1002, 1102 as described in FIGS. 2, 3-8, 9, 10, and 11-14 and disclosed above have certain features, it should be understood that it is not necessary for a certain feature of one example capacitor structure 232, 304, 900, 1002, 1102 to be used exclusively with that example. Instead, any of the features of the example capacitor structure 232, 304, 900, 1002, 1102 described above and/or depicted in the drawings can be combined with any of the example structures of other examples. Furthermore, in some examples, an IC device can include multiple capacitor structures disclosed herein with different ones of such capacitor structures implemented according to different ones of the example capacitor structures 232, 304, 900, 1002, 1102 described above in connection with FIGS. 2-14.

Figure 16:
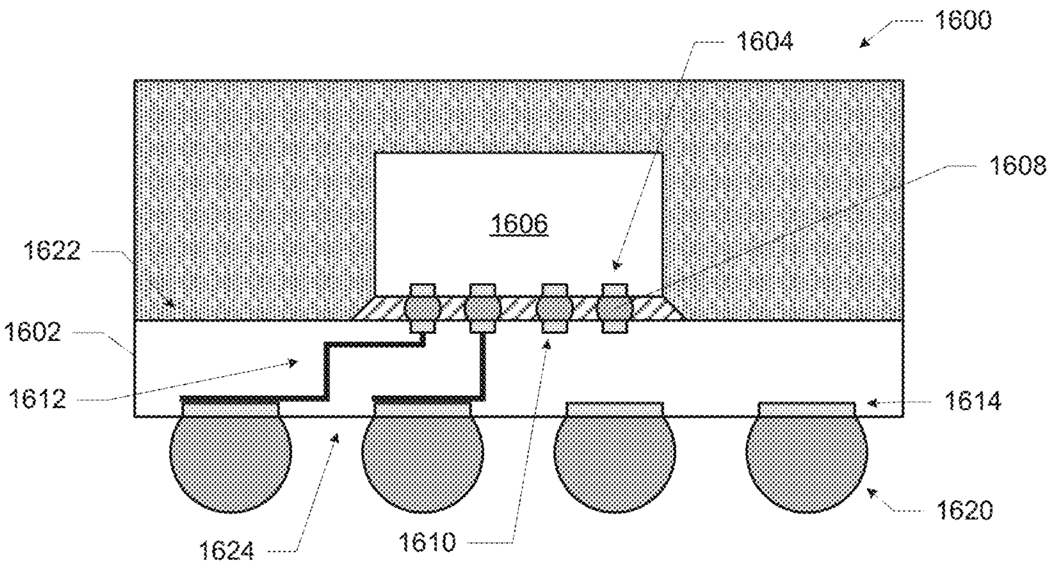
FIG. 16 is a cross-sectional side view of an IC package that may include an IC device in accordance with teachings disclosed herein.

FIG. 16 is a cross-sectional view of an example semiconductor package 1600 that may include one or more capacitor structures 232, 304, 900, 1002, 1102 disclosed herein. The semiconductor package 1600 includes a package substrate 1602. The IC package 1600 includes a die 1606 coupled to the package substrate 1602 via conductive contacts 1604 of the die 1606, first-level interconnects 1608, and conductive contacts 1610 of the package substrate 1602. The conductive contacts 1610 may be coupled to conductive pathways 1612 through the package substrate 1602, allowing circuitry within the die 1606 to electrically couple to various ones of the conductive contacts 1614 (or to other devices included in the package substrate 1602, not shown). The first-level interconnects 1608 illustrated in FIG. 16 are solder bumps, but any suitable first-level interconnects 1608 may be used. As used herein, a "conductive contact" refers to a portion of conductive material (e.g., metal) serving as an electrical interface between different components. Conductive contacts may be recessed in, flush with, or extending away from a surface of a component, and may take any suitable form (e.g., a conductive pad or socket).

Second-level interconnects 1620 may be coupled to the conductive contacts 1614. The second-level interconnects 1620 illustrated in FIG. 16 are solder balls (e.g., for a ball grid array arrangement), but any suitable second-level interconnects 1620 may be used (e.g., pins in a pin grid array arrangement or lands in a land grid array arrangement). The second-level interconnects 1620 may be used to couple the IC package 1600 to another component, such as a circuit board (e.g., a motherboard), an interposer, or another IC package (e.g., IC device 200 of FIG. 2, IC device 300 of FIGS. 3-8, IC device 1000 of FIG. 10, IC device 1100 of FIG. 11, IC device 1300 of FIG. 13, IC device 1400 of FIG. 14), as known in the art and as discussed below with reference to FIG. 17.

The die 1606 may take the form of any of the examples of the die 102 discussed herein (e.g., may include any of the examples of the IC device 200, 300, 1000, 1100, 1300, 1400). In some examples, the die 1606 may include one or more capacitor structures 232, 304, 900, 1002, 1102 (e.g., as discussed above with reference to FIGS. 2-15). Although a single die 1606 is illustrated in the IC package 1600 of FIG. 16, an IC package 1600 may include multiple dies 1606. An IC package 1600 may include any other active or passive components known in the art.

Figure 17:
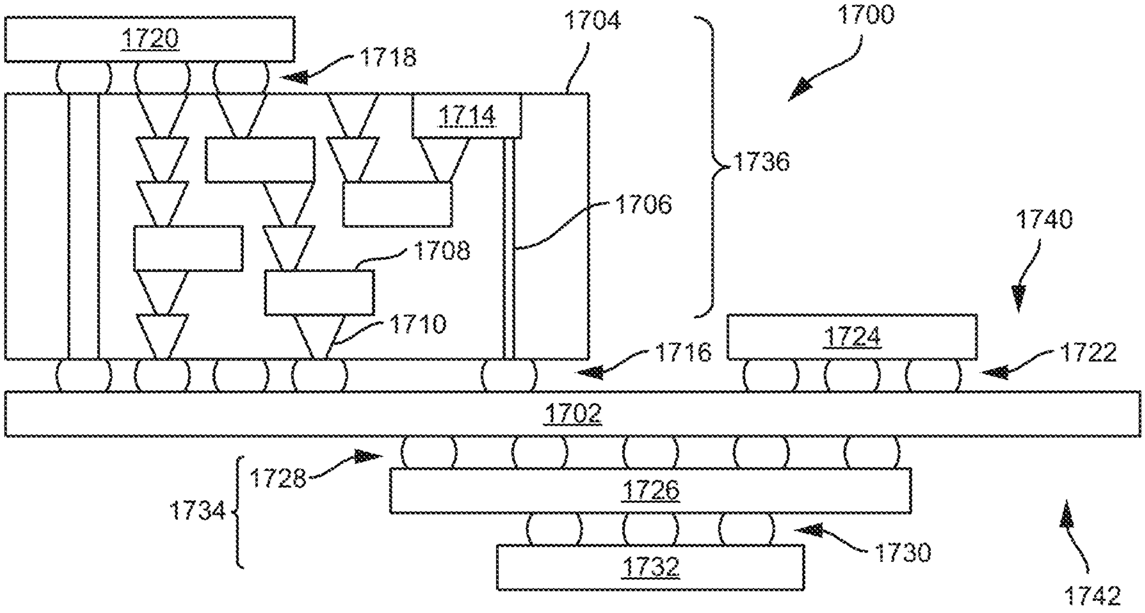
FIG. 17 is a cross-sectional side view of an IC device assembly that may include an IC package constructed in accordance with teachings disclosed herein.

FIG. 17 is a cross-sectional side view of an IC device assembly 1700 (e.g., IC package) that may include an example IC device 200, 300, 1000, 1100, 1300, 1400 disclosed herein. The IC device assembly 1700 includes a number of components disposed on a circuit board 1702 (which may be, for example, a motherboard). The IC device assembly 1700 includes components disposed on a first face 1740 of the circuit board 1702 and an opposing second face 1742 of the circuit board 1702; generally, components may be disposed on one or both faces 1740 and 1742.

In some examples, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other examples, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 102 of FIG. 1), an IC device (e.g., the IC device 200 300, 1000, 1100, 1300, 1400), a capacitor structure 232, 304, 900, 1002, 1102, or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the example illustrated in FIG. 17, the IC package 1720 and the circuit board 1702 are attached to opposing sides of the interposer 1704; in other examples, the IC package 1720 and the circuit board 1702 may be attached to a same side of the interposer 1704.

In some examples, three or more components may be interconnected by way of the interposer 1704.

In some examples, the interposer 1704 may be formed as a PCB, including multiple metal layers separated from one another by layers of dielectric material and interconnected by electrically conductive vias. In some examples, the interposer 1704 may be formed of an epoxy resin, a fiberglass-reinforced epoxy resin, an epoxy resin with inorganic fillers, a ceramic material, or a polymer material such as polyimide. In some examples, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the examples discussed above with reference to the coupling components 1716, and the IC package 1724 may take the form of any of the examples discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include a first IC package 1726 and a second IC package 1732 coupled together by coupling components 1730 such that the first IC package 1726 is disposed between the circuit board 1702 and the second IC package 1732. The coupling components 1728, 1730 may take the form of any of the examples of the coupling components 1716 discussed above, and the IC packages 1726, 1732 may take the form of any of the examples of the IC package 1720 discussed above. The package-on-package structure 1734 may be configured in accordance with any of the package-on-package structures known in the art.

Figure 18:
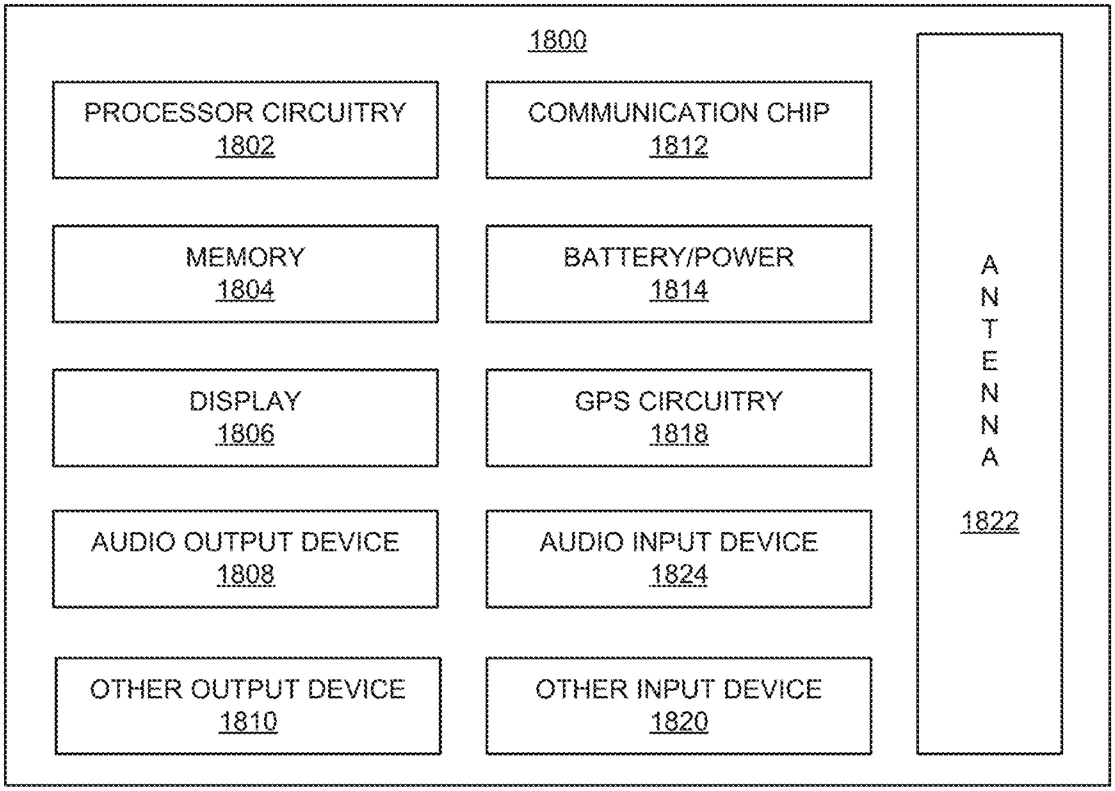
FIG. 18 is a block diagram of an example electrical device that may include an IC package constructed in accordance with teachings disclosed herein.

FIG. 18 is a block diagram of an example electrical device 1800 that may include one or more of the example capacitor structures 232, 304, 900, 1002, 1102, etc. For example, any suitable ones of the components of the electrical device 1800 may include one or more of the device assemblies 1600, IC devices 200, 300, 1000, 1100, 1300, 1400 or dies 102 disclosed herein. A number of components are illustrated in FIG. 18 as included in the electrical device 1800, but any one or more of these components may be omitted or duplicated, as suitable for the application. In some examples, some or all of the components included in the electrical device 1800 may be attached to one or more motherboards. In some examples, some or all of these components are fabricated onto a single system-on-a-chip (SoC) die.

Additionally, in various examples, the electrical device 1800 may not include one or more of the components illustrated in FIG. 18, but the electrical device 1800 may include interface circuitry for coupling to the one or more components. For example, the electrical device 1800 may not include a display 1806, but may include display interface circuitry (e.g., a connector and driver circuitry) to which a display 1806 may be coupled. In another set of examples, the electrical device 1800 may not include an audio input device 1824 (e.g., microphone) or an audio output device 1808 (e.g., a speaker, a headset, earbuds, etc.), but may include audio input or output device interface circuitry (e.g., connectors and supporting circuitry) to which an audio input device 1824 or audio output device 1808 may be coupled.

The electrical device 1800 may include programmable circuitry 1802 (e.g., one or more processing devices). The programmable circuitry 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1804 may include memory that shares a die with the programmable circuitry 1802. This memory may be used as cache memory and may include embedded dynamic random access memory (eDRAM) or spin transfer torque magnetic random access memory (STT-MRAM).

In some examples, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other examples. The electrical device 1800 may include an antenna 1822 to facilitate wireless communications and/or to receive other wireless communications (such as AM or FM radio transmissions).

In some examples, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some examples, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display 1806 (or corresponding interface circuitry, as discussed above). The display 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include GPS circuitry 1818. The GPS circuitry 1818 may be in communication with a satellite-based system and may receive a location of the electrical device 1800, as known in the art.

The electrical device 1800 may include any other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include any other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1800 may be any other electronic device that processes data.

The foregoing examples of the IC devices 200, 300, 1000, 1100, 1300, 1400, the second vias 230, 320, and/or the capacitor structures 232, 304, 900, 1002, 1102 teach or suggest different features. Although each example IC devices 200, 300, 1000, 1100, 1300, 1400, the second vias 230, 320, and/or the capacitor structures 232, 304, 900, 1002, 1102 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms “a” (or “an”), “one or more”, and “at least one” are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable the fabrication of capacitor structures in opened vias to increase capacitance in integrated circuit devices. Disclosed examples enable capacitor structures to be provided as part of back-end-of-line manufacturing processes. Example capacitor structures disclosed herein can be implemented in mmW integrated circuits to increase capacitance in an IC package for implementation at mmW frequencies. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to implement capacitors in opened vias of semiconductor dies are disclosed herein. Further examples and combinations thereof include the following:

Example 1 includes a semiconductor die comprising a first dielectric material disposed between a first metal interconnect and a second metal interconnect; and a capacitor positioned within a via extending through the first dielectric material between the first and second metal interconnects, the capacitor including a second dielectric material disposed in the via between the first and second metal interconnects.

Example 2 includes the semiconductor die of example 1, wherein the capacitor includes a conductive wall protruding from the first metal interconnect toward the second metal interconnect, the conductive wall disposed between the first dielectric material and the second dielectric material.

Example 3 includes the semiconductor die of example 2, wherein the conductive wall is formed of a same material as the first metal interconnect.

Example 4 includes the semiconductor die of any one of examples 1-3, wherein the first metal interconnect is in a first metal layer of the semiconductor die and the second metal interconnect is in a second metal layer of the semiconductor die, the first metal layer directly adjacent to the second metal layer.

Example 5 includes the semiconductor die of example 4, wherein the first metal layer or the second metal layer corresponds to a metal 1-layer in the semiconductor die.

Example 6 includes the semiconductor die of example 4, wherein the via is a first via and the capacitor is a first capacitor, the semiconductor die further including a transistor having a source, a gate, and a drain; a first contact electrically coupled to the gate; a second contact electrically coupled to the source; a third contact electrically coupled to the drain; a third metal interconnect directly coupled to at least one of the first contact, the second contact, or the third contact; a second capacitor positioned with the second via.

Example 7 includes the semiconductor die of example 6, wherein the third metal interconnect corresponds to at least one of the first metal interconnect or the second metal interconnect.

Example 8 includes the semiconductor die of example 4, further including transistors; and multiple additional metal layers closer to the transistors than the first and second metal layers are to the transistors.

Example 9 includes the semiconductor die of example 4, further including transistors; and multiple additional metal layers farther away from the transistors than the first and second metal layers are from the transistors.

Example 10 includes the semiconductor die of any one of examples 1-9, wherein the capacitor is a first capacitor, the first dielectric material is a first layer of the first dielectric material, and the via is a first via, the semiconductor die further including a second capacitor in a second via in a second layer of the first dielectric material.

Example 11 includes the semiconductor die of example 10, wherein the second capacitor is larger than the first capacitor.

Example 12 includes the semiconductor die of any one of examples 1-11, wherein the semiconductor die implements a millimeter wave integrated circuit, and the capacitor is closer to a back end of the semiconductor die than a front end of the semiconductor die.

Example 13 includes the semiconductor die of any one of examples 1-12, wherein the via is one of a plurality of vias, and the capacitor is one of a plurality of capacitors positioned within ones of the plurality of vias, the first metal interconnect defining a first finger structure, the second metal interconnect defining a second finger structure, different ones of the plurality of vias extending between the first and second finger structures, first electrodes of the plurality of capacitors electrically coupled to the first finger structure, second electrodes of the plurality of capacitors electrically coupled to the second finger structure.

Example 14 includes the semiconductor die of example 13, wherein the first metal interconnect defines a third finger structure, and the second metal interconnect defines a fourth finger structure, the first finger structure electrically coupled to the third finger structure via the first metal interconnect, the second finger structure electrically coupled to the fourth finger structure via the second metal interconnect, additional ones of the plurality of vias extending between the third and fourth finger structures.

Example 15 includes a semiconductor component comprising a first layer of metal; a second layer of metal adjacent the first layer of metal; a dielectric layer between the first and second layers of metal; a metal protrusion extending from the first layer of metal toward the second layer of metal through a via in the dielectric layer; and a dielectric material, in the via, separating the metal protrusion from the second layer of metal.

Example 16 includes the semiconductor component of example 15, wherein the dielectric material is a first dielectric material and the dielectric layer includes a second dielectric material different than the first dielectric material, the first dielectric material associated with a first dielectric constant that is higher than a second dielectric constant associated with the second dielectric material.

Example 17 includes the semiconductor component of any one of examples 15-16, further including a barrier layer positioned between the dielectric material and the metal protrusion.

Example 18 includes the semiconductor component of any one of examples 15-17, wherein the metal protrusion is a first metal protrusion, the semiconductor component further including a second metal protrusion extending from the second layer of metal toward the first layer of metal through the via, the dielectric material positioned between the first metal protrusion and the second metal protrusion.

Example 19 includes the semiconductor component of claim 18, wherein the first metal protrusion defines a cavity, and the second metal protrusion extends into the cavity.

Example 20 includes a method comprising providing a via in an inter-metal dielectric layer of a semiconductor die, the inter-metal dielectric layer disposed on a first metal layer; depositing a dielectric material on exposed surfaces within the via; and depositing a second metal layer on the inter-metal dielectric layer, metal associated with the second metal layer to fill a remaining space in the via.

Example 21 includes the method of example 20, wherein the via is a first via, the method further including providing a second via in the inter-metal dielectric layer during a same process as the providing of the first via; and depositing a resist material to cover the second via, the depositing of the dielectric material implemented while the second via is covered by the resist material.

Example 22 includes the method of any one of examples 20-21, further including, prior to the depositing of the dielectric material providing a metal structure in the via, the metal structure in contact with the first metal layer, the metal structure to protrude away from the first metal layer by a distance, the distance being less than a thickness of the inter-metal dielectric layer.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A semiconductor die comprising:

a first dielectric material between a first metal interconnect and a second metal interconnect, the first metal interconnect in a first metal layer of the semiconductor die, the first metal layer including first electrical traces, the second metal interconnect in a second metal layer of the semiconductor die, the second metal layer different from the first metal layer, the second metal layer including second traces, the first dielectric material in direct contact with a first surface of the first metal interconnect; and a capacitor at least partially within a via extending through the first dielectric material between the first and second metal interconnects, the capacitor including (i) a first electrode corresponding to the first metal interconnect, (ii) a second electrode corresponding to the second metal interconnect, the second electrode including a portion of a material of the second metal interconnect that protrudes into the via, and (iii) a second dielectric material in the via between the first and second metal interconnects, a portion of the second dielectric material located along a central axis of the via, the portion of the second dielectric material in direct contact with the first surface of the first metal interconnect.

2. The semiconductor die of claim 1, wherein the capacitor includes a conductive wall protruding from the first metal interconnect toward the second metal interconnect, the conductive wall between the first dielectric material and the second dielectric material.

3. The semiconductor die of claim 2, wherein the conductive wall includes a same material as the first metal interconnect.

4. The semiconductor die of claim 1, wherein the first metal layer is directly adjacent to the second metal layer.

5. The semiconductor die of claim 4, wherein the first metal layer or the second metal layer corresponds to a Metal 1 (M1) layer in the semiconductor die.

6. The semiconductor die of claim 4, including:

transistors; and multiple additional metal layers closer to the transistors than the first and second metal layers are to the transistors.

7. The semiconductor die of claim 4, including:

transistors; and multiple additional metal layers farther away from the transistors than the first and second metal layers are from the transistors.

8. The semiconductor die of claim 1, wherein the capacitor is a first capacitor, the first dielectric material is a first layer of the first dielectric material, and the via is a first via, the semiconductor die including a second capacitor in a second via in a second layer of the first dielectric material.

9. The semiconductor die of claim 8, wherein the second capacitor is larger than the first capacitor.

10. The semiconductor die of claim 1, wherein the semiconductor die implements a millimeter wave integrated circuit, and the capacitor is closer to a back end of the semiconductor die than a front end of the semiconductor die.

11. The semiconductor die of claim 1, wherein the via is one of a plurality of vias, and the capacitor is one of a plurality of capacitors within ones of the plurality of vias, the first metal interconnect defining a first finger structure, the second metal interconnect defining a second finger structure, different ones of the plurality of vias extending between the first and second finger structures, first electrodes of the plurality of capacitors electrically coupled to the first finger structure, second electrodes of the plurality of capacitors electrically coupled to the second finger structure.

12. The semiconductor die of claim 11, wherein the first metal interconnect defines a third finger structure, and the second metal interconnect defines a fourth finger structure, the first finger structure electrically coupled to the third finger structure via the first metal interconnect, the second finger structure electrically coupled to the fourth finger structure via the second metal interconnect, additional ones of the plurality of vias extending between the third and fourth finger structures.

13. A semiconductor component comprising:

a first layer of metal;

a second layer of metal adjacent the first layer of metal;

a dielectric layer between the first and second layers of metal, the dielectric layer including a first dielectric material;

a first metal protrusion extending from the first layer of metal toward the second layer of metal through a via in the dielectric layer;

a second metal protrusion extending from the second layer of metal toward the first layer of metal through the via, the first metal protrusion to at least partially surround the second metal protrusion; and a second dielectric material in the via, the second dielectric material separating the first metal protrusion from the second layer of metal and separating the first metal protrusion from the second metal protrusion, the second dielectric material different from the first dielectric material, the first and second dielectric materials to directly contact the first layer of metal at different points along a common plane defined by a surface of the first layer of metal, the surface of the first layer of metal facing towards the second layer of metal.

14. The semiconductor component of claim 13, wherein the first dielectric material is associated with a first dielectric constant that is lower than a second dielectric constant associated with the second dielectric material.

15. The semiconductor component of claim 13, including a barrier layer between the second dielectric material and the first metal protrusion.

16. A method of manufacturing the semiconductor component of claim 13, the method comprising:

providing the via in the dielectric layer, the dielectric layer on the second layer of metal;

depositing the second dielectric material on exposed surfaces within the via; and depositing the first layer of metal on the dielectric layer, metal associated with the first layer of metal to fill a remaining space in the via.

17. The method of claim 16, wherein the via is a first via, the method including:

providing a second via in the dielectric layer during a same process as the providing of the first via; and depositing a resist material to cover the second via, the depositing of the second dielectric material implemented while the second via is covered by the resist material.

18. The method of claim 16, including, prior to the depositing of the second dielectric material, providing a metal structure in the via, the metal structure in contact with the second layer of metal, the metal structure to protrude away from the second layer of metal by a distance, the distance being less than a thickness of the dielectric layer.

19. The semiconductor die of claim 1, wherein the via is a first via, the semiconductor die including a conductive material filling a second via extending through the first dielectric material, the conductive material extending from the first metal layer to the second metal layer, the first and second vias having approximately a same size.

20. The semiconductor die of claim 1, wherein the portion of the material of the second metal interconnect is an integral extension of the second metal interconnect.

* * * * *